(12) United States Patent
Shim et al.

(10) Patent No.: US 9,111,617 B2
(45) Date of Patent: Aug. 18, 2015

(54) THREE-DIMENSIONAL SEMICONDUCTOR MEMORY DEVICE

(75) Inventors: Sunil Shim, Seoul (KR); Jang-gn Yun, Hwaseong-si (KR); Jeonghyuk Choi, Seongnam-si (KR); Kwang Soo Seol, Yongin-si (KR); Jaehoon Jang, Seongnam-si (KR); Jungdal Choi, Hwaseong-si (KR)

(73) Assignee: SAMSUNG ELECTRONICS CO., LTD., Suwon-Si, Geonggi-Do (KR)

( * ) Notice: Subject to any disclaimer, the term of this patent is extended or adjusted under 35 U.S.C. 154(b) by 250 days.

(21) Appl. No.: 13/585,963

(22) Filed: Aug. 15, 2012

(65) Prior Publication Data

US 2013/0092994 A1 Apr. 18, 2013

(30) Foreign Application Priority Data

Oct. 18, 2011 (KR) ........................ 10-2011-0106460

(51) Int. Cl.
*H01L 29/78* (2006.01)
*G11C 16/04* (2006.01)
*H01L 27/115* (2006.01)

(52) U.S. Cl.
CPC ........ *G11C 16/0466* (2013.01); *G11C 16/0483* (2013.01); *H01L 27/1157* (2013.01); *H01L 27/11524* (2013.01); *H01L 27/11556* (2013.01); *H01L 27/11582* (2013.01)

(58) Field of Classification Search
CPC .................................................. H01L 27/11553
USPC .................................................. 257/314–326
See application file for complete search history.

(56) References Cited

U.S. PATENT DOCUMENTS

| 2010/0202206 | A1* | 8/2010 | Seol et al. ................. 365/185.17 |
| 2010/0207194 | A1 | 8/2010 | Tanaka et al. |
| 2010/0224929 | A1* | 9/2010 | Jeong et al. ................... 257/324 |
| 2010/0276743 | A1* | 11/2010 | Kuniya et al. ................. 257/315 |
| 2010/0315875 | A1 | 12/2010 | Kim et al. |

\* cited by examiner

*Primary Examiner* — Matthew W Such
*Assistant Examiner* — Ali Naraghi
(74) *Attorney, Agent, or Firm* — F. Chau & Associates, LLC

(57) ABSTRACT

A semiconductor memory device is provided including first and second cell strings formed on a substrate, the first and second cell strings jointly connected to a bit line, wherein each of the first and second cell strings includes a ground selection unit, a memory cell, and first and second string selection units sequentially formed on the substrate to be connected to each other, wherein the ground selection unit is connected to a ground selection line, the memory cell is connected to a word line, the first string selection unit is connected to a first string selection line, and the second string selection unit is connected to a second string selection line, and wherein the second string selection unit of the first cell string has a channel dopant region.

8 Claims, 21 Drawing Sheets

THREE-DIMENSIONAL SEMICONDUCTOR MEMORY DEVICE

CROSS-REFERENCE TO RELATED APPLICATIONS

This U.S. non-provisional patent application claims priority under 35 U.S.C. §119 to Korean Patent Application No. 10-2011-0106460 filed on Oct. 18, 2011, the entirety of which is incorporated by reference herein.

BACKGROUND

Embodiments of the inventive concept relate to three-dimensional (3D) semiconductor memory devices and more particularly to 3D semiconductor memory devices with improved integration density and reliability.

High integration density of semiconductor memory devices, which may contribute to cost savings, may be limited by their available planar area.

Three-dimensional (3D) semiconductor memory devices may address such limitations.

SUMMARY

Embodiments of the inventive concept may provide three-dimensional (3D) semiconductor memory devices with improved integration density and reliability.

In an embodiment, a three-dimensional (3D) semiconductor memory device may include an electrode structure including a plurality of word lines and first and second string selection lines vertically stacked on a substrate, first and second semiconductor pillars penetrating the electrode structure, a data storage layer disposed between the electrode structure and the first and second semiconductor pillars, and a bit line connected in common to the first and second semiconductor pillars. Each of the first and second semiconductor pillars may constitute first and second string selection transistor units which have threshold voltages different from each other and are connected in series to each other. The first string selection line may be connected in common to the second string selection transistor unit of the first semiconductor pillar and the first string selection transistor unit of the second semiconductor pillar. The second string selection line may be connected in common to the first string selection transistor unit of the first semiconductor pillar and the second string selection transistor unit of the second semiconductor pillar.

In an embodiment, a three-dimensional (3D) semiconductor memory device may include an electrode structure including a plurality of word lines and a string selection line vertically stacked on a substrate, first and second semiconductor pillars penetrating the electrode structure, a data storage layer disposed between the electrode structure and the first and second semiconductor pillars, and a bit line crossing over the electrode structure, the bit line connected in common to the first and second semiconductor pillars. The string selection line and the first semiconductor pillar may constitute a first string selection transistor unit having a first threshold voltage, and the string selection line and the second semiconductor pillar may constitute a second string selection transistor unit having a second threshold voltage.

BRIEF DESCRIPTION OF THE DRAWINGS

The embodiments of the inventive concept will become more apparent in view of the attached drawings and accompanying detailed description.

DETAILED DESCRIPTION OF THE EMBODIMENTS

Figure 1:
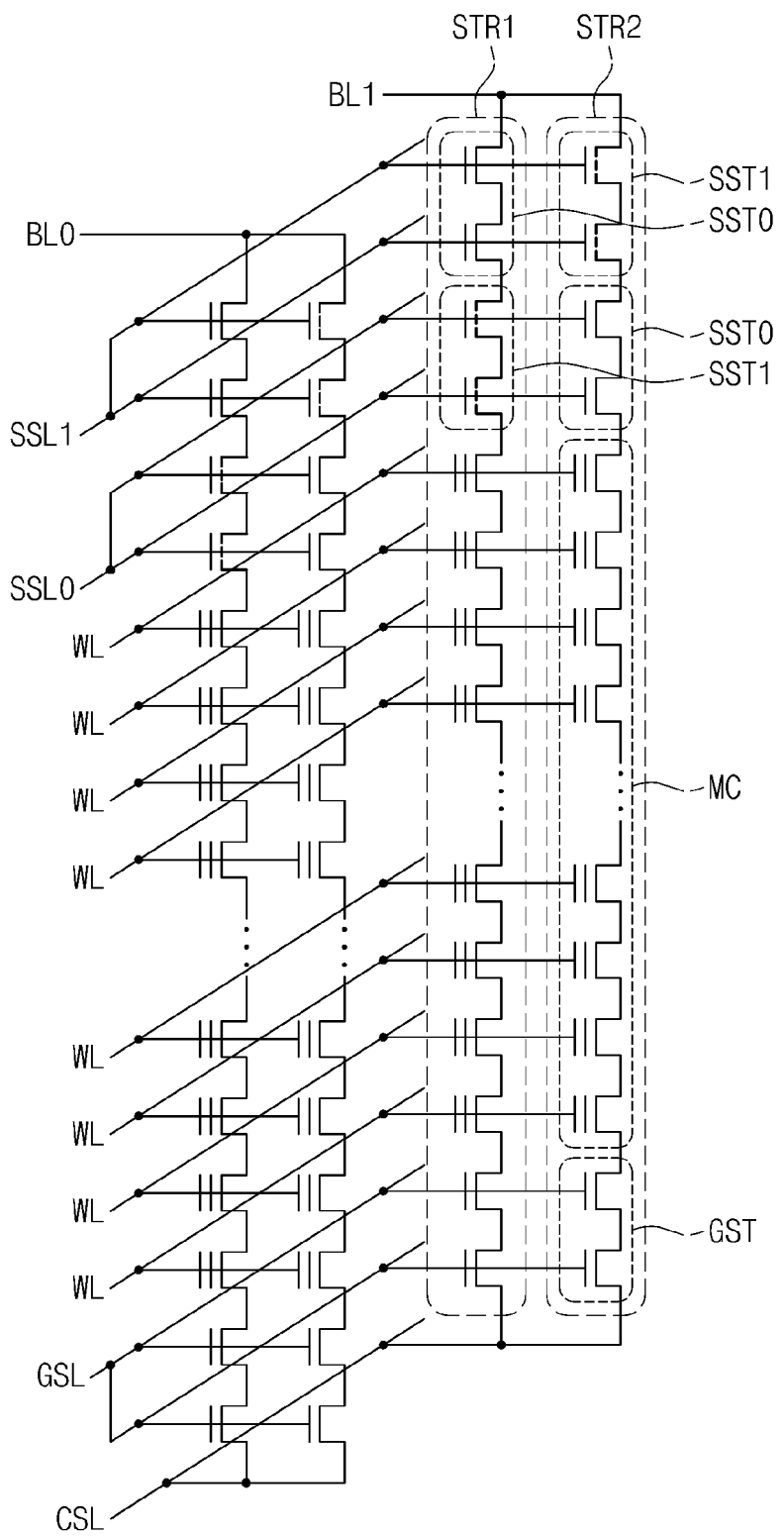
FIG. 1 is a circuit diagram illustrating a 3D semiconductor memory device according to an embodiment of the inventive concept.

The embodiments of the inventive concept will now be described more fully hereinafter with reference to the accompanying drawings. It should be noted, however, that the inventive concept is not limited to the following exemplary embodiments, and may be implemented in various forms. In the drawings, embodiments of the inventive concept are not limited to the specific examples provided herein and may be exaggerated for clarity.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present.

The same reference numerals or the same reference designators may denote the same or substantially the same elements throughout the specification and the drawings.

FIG. 1 is a circuit diagram illustrating a 3D semiconductor memory device according to an embodiment of the inventive concept.

Referring to FIG. 1, a 3D semiconductor memory device according to an embodiment of the inventive concept includes a plurality of bit lines BL0 and BL1, a common source line CSL, and a plurality of cell strings STR1 and STR2 connected in parallel between the common source line CSL and the bit lines BL0 and BL1.

In an embodiment, a plurality of the cell strings STR1 and STR2 are connected in common to each of the bit lines BL0 and BL1. The cell strings STR1 and STR2 are connected in common to the common source line CSL. A plurality of the cell strings STR1 and STR2 are disposed between one bit line BL0 or BL1 and one common source line CSL. The cell strings STR1 and STR2 connected in common to the bit lines BL0 and BL1 share string and ground selection lines SSL0, SSL1, and GSL and word lines WL.

For example, as illustrated in FIG. 1, first and second cell strings STR1 and STR2 are connected in common to one bit line BL0 or BL1. The first and second cell strings STR1 and STR2 connected in common to one bit line BL0 or BL1 share the string and ground selection lines SSL0, SSL1, and GSL and the word lines WL.

In an embodiment, each of the cell strings STR1 and STR2 includes a string selection element connected to the bit line BL0 or BL1, a ground selection element connected to the common source line CSL, and a plurality of memory cells MC connected in series between the string selection element and the ground selection element. The string selection element includes a plurality of string selection transistor units SST0 and SST1 connected in series to each other. The ground selection element includes at least one ground selection transistor unit GST.

The ground selection line GSL, the plurality of word lines WL, and the plurality of string selection lines SSL0 and SSL1, which are disposed between the common source line CSL and the bit lines BL0 and BL1, are connected to or used as gate electrodes of the ground selection transistor unit GST, the memory cells MC, and the sting selection transistor units SST0 and SST1, respectively. The plurality of string selection lines SSL0 and SSL1 control electrical connection between the bit lines BL0 and BL1 and the cell strings STR1 and STR2. The ground selection line GSL controls electrical connection between the cell strings STR1 and STR2 and the common source line CSL. The plurality of word lines WL are combined with the memory cells MC and control the memory cells MC. Each of the memory cells MC includes a data storage component.

In an embodiment, the number of the string selection transistor units SST0 and SST1 in one cell string STR1 or STR2 is equal to or greater than the number of the cell strings STR1 and STR2 connected in common to one bit line BL0 or BL1. For example, as illustrated in FIG. 1, each of the first and second cell strings STR1 and STR2 includes first and second string selection transistor units SST0 and SST1 connected in series to each other.

The string selection transistor units SST0 and SST1 included in one cell string STR1 and STR2 have threshold voltages different from each other.

In an embodiment, the first string selection transistor unit SST0 has a threshold voltage Vth1, and the second string selection transistor unit SST1 has a threshold voltage Vth2 less than the threshold voltage Vth1 of the first string selection transistor unit SST0 (e.g., Vth1>Vth2). The threshold voltage Vth1 of the first string selection transistor unit SST0 is also referred to as a "first threshold voltage", and the threshold voltage Vth2 of the second string selection transistor unit SST1 is also referred to as a "second threshold voltage". The first and second string selection transistor units SST0 and SST1 are turned on by a first operation voltage Vop1. The first operation voltage Vop1 is greater than the first threshold voltage Vth1 and the second threshold voltage Vth2 (e.g., Vop1>Vth1, Vop1>Vth2). The first string selection transistor unit SST0 is turned off by a second operation voltage Vop2, and the second string selection transistor unit SST1 is turned on by the second operation voltage Vop2. For example, the second operation voltage Vop2 is greater than the second threshold voltage Vth2 and less than the first threshold voltage Vth1 (e.g., Vth1>Vop2>Vth2).

In an embodiment, an electrical polarity of the threshold voltage of the first string selection transistor unit SST0 is different from an electrical polarity of the threshold voltage of the second string selection transistor unit SST1. For example, the threshold voltage of the first string selection transistor unit SST0 has a positive value (e.g., about 1V), and the threshold voltage of the second string selection transistor unit SST1 has a negative value (e.g., about −1V). A bias voltage for turning on the first string selection transistor unit SST0 is equal to or greater than about 1V (e.g., about 1V to about 3V). A bias voltage for turning on the second string selection transistor unit SST1 is equal to or greater than about −1V and less than about 1V (e.g., about 0V).

For example, the string selection transistor units SST0 and SST1 in one cell string STR1 or STR2 include at least one enhancement mode field effect transistor and at least one depletion mode field effect transistor. For example, the first string selection transistor unit SST0 includes an enhancement mode field effect transistor, and the second selection transistor unit SST1 includes a depletion mode field effect transistor.

In an embodiment, the first string selection transistor units SST0, which are respectively included in the cell strings STR1 and STR2 different from each other, include threshold voltages different from each other. The second string selection transistor units SST1, which are respectively included in the cell strings STR1 and STR2 different from each other, include threshold voltages different from each other. For example, the first string selection transistor units SST0 and the second string selection transistor units SST1 of first and second cell strings STR1 and STR2 have threshold voltages different from each other.

The first and second cell strings STR1 and STR2 including the first and second string selection transistor units SST0 and SST1 of which the threshold voltages are different from each other are connected in common to one bit line BL0 or BL1. The plurality of cell strings STR1 and STR2 sharing one bit line BL0 or BL1 share the string selection lines SSL0 and SSL1. For example, the electrical connection between the plurality of cell strings STR1 and STR2 and one bit line BL0 or BL1 is controlled through the string selection lines SSL0 and SSL1.

The first string selection transistor unit SST0 of the first cell string STR1 is connected to one bit line, and the second string selection transistor unit SST1 of the second cell string STR2 is connected to the bit line.

The string selection line SSL0 or SSL1 shared by the plurality of cell strings STR1 and STR2 is connected to at least one first string selection transistor unit SST0 and at least one second string selection transistor unit SST1. In more detail, the first string selection transistor unit SST0 of the first cell string STR1 and the second string selection transistor unit SST1 of the second cell string STR2 are controlled by a second string selection line SSL1. The second string selection transistor unit SST1 of the first cell string STR1 and the first string selection transistor unit SST0 of the second cell string STR2 are controlled by a first string selection line SSL0.

Since the threshold voltages of the first and second string selection transistor units SST0 and SST1 controlled by the first or second string selection line SSL0 or SSL1 are different from each other, the first and second string selection transistor units SST0 and SST1 are respectively perform operations different from each other by a voltage applied to the first or second string selection line SSL0 or SSL1. Thus, the electrical connection between the first and second cell strings STR1 and STR2 and one bit line BL0 or BL1 is selectively controlled according to voltages applied to the first and second string selection lines SSL0 and SSL1. In other words, one of the first and second cell strings STR1 and STR2 is selectively connected to the bit line BL0 or BL1.

In an embodiment, each of the first and second string selection transistor units SST0 and SST1 includes a plurality of field effect transistors (FET). For example, as illustrated in FIG. 1, each of the first and second string selection transistor units SST0 and SST1 includes two field effect transistors. Gate electrodes of the two field effect transistors are electrically connected in common to the first or second string selection line SSL0 or SSL1. Thus, the two field effect transistors are operated like one transistor.

Figure 2:
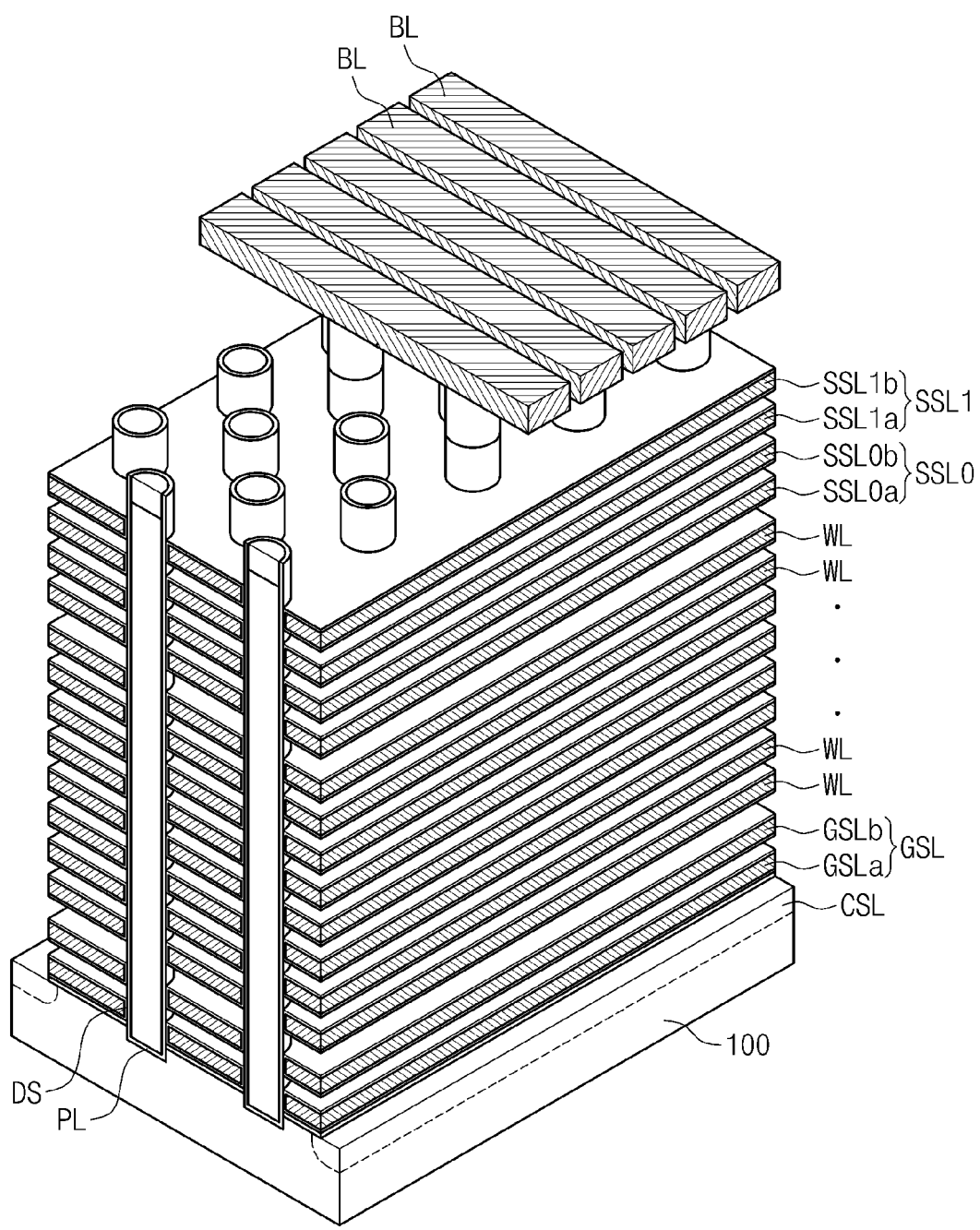
FIG. 2 is a perspective view illustrating a 3D semiconductor memory device according to an embodiment of the inventive concept.
Figure 3:
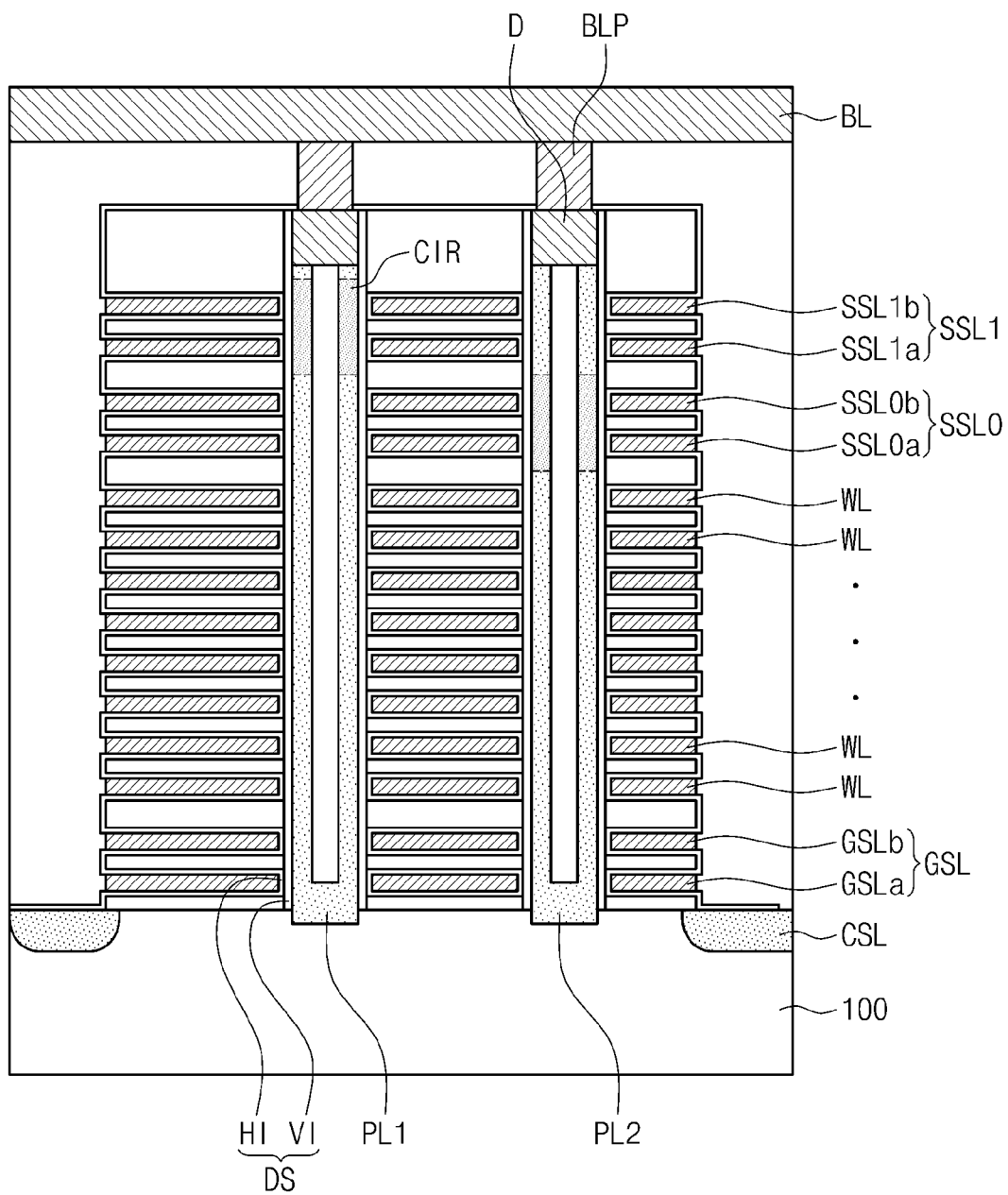
FIG. 3 is a cross-sectional view illustrating a 3D semiconductor memory device according to an embodiment of the inventive concept.
Figure 4:
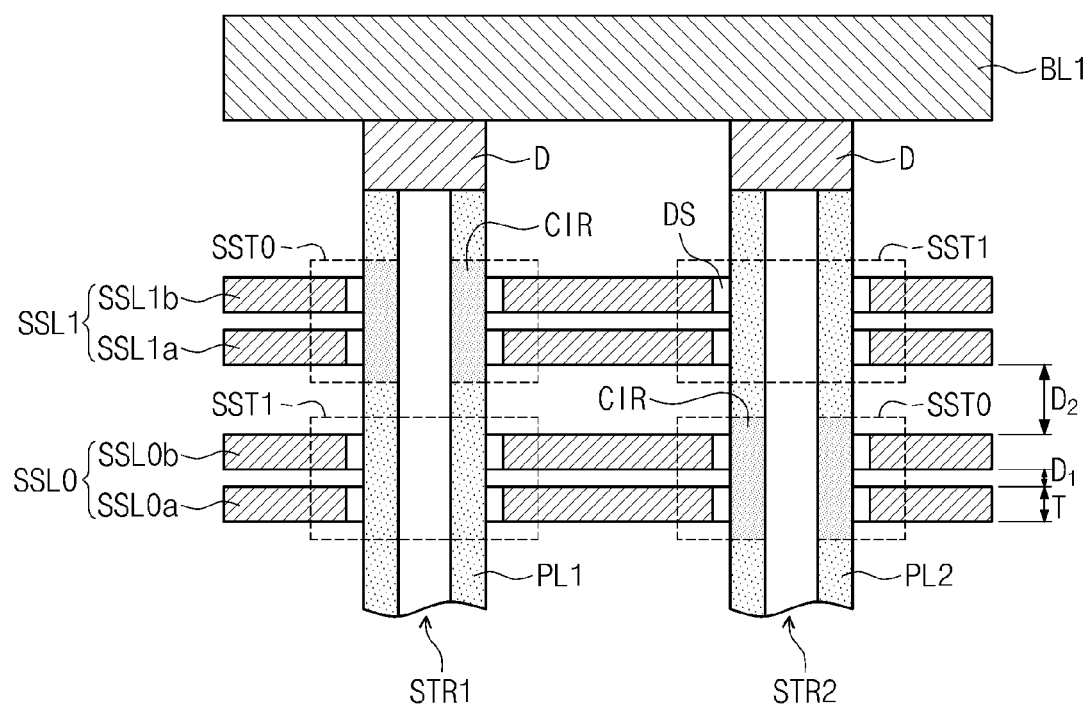
FIG. 4 is a cross-sectional view illustrating a portion of a 3D semiconductor memory device according to an embodiment of the inventive concept.

FIG. 2 is a perspective view illustrating a 3D semiconductor memory device according to an embodiment of the inventive concept. FIG. 3 is a cross-sectional view illustrating a 3D semiconductor memory device according to an embodiment of the inventive concept. FIG. 4 is a cross-sectional view illustrating a portion of a 3D semiconductor memory device according to an embodiment of the inventive concept.

Referring to FIGS. 1 to 4, the common source line CSL includes a conductive layer disposed on a substrate 100 or a dopant region formed in the substrate 100.

The bit lines BL include conductive patterns (e.g., metal lines) which are spaced apart from the substrate 100 to be disposed over the substrate 100. The bit lines BL are two-dimensionally arranged. A plurality of cell strings STR1 and STR2 are electrically connected in parallel to each of the bit lines BL. Thus, the cell strings are two-dimensionally arranged on the common source line CSL or the substrate 100.

In an embodiment, a plurality of semiconductor pillars PL1 and PL2 vertically extended from the substrate 100 are connected in common to one bit line BL. One gate electrode structure is disposed on the substrate 100 to cross sidewalls of the plurality of semiconductor pillars PL1 and PL2. The gate electrode structure includes a ground selection line GSL, a plurality of word lines WL, and a plurality of string selection lines SSL0 and SSL1 which are vertically stacked on the substrate 100. In an embodiment, the plurality of cell strings STR1 and STR2 connected in common to the bit line BL share the string selection lines SSL0 and SSL1. Thus, the plurality of semiconductor pillars PL1 and PL2 penetrate the string selection lines SSL0 and SSL1. The number of the string selection lines SSL0 and SSL1 according to an embodiment reduces as compared with when string selection lines separated from each other respectively correspond to the cell strings STR1 and STR2. Thus, it is possible to improve the integration density of the 3D semiconductor memory device.

In more detail, the cell strings STR1 and STR2 illustrated in FIG. 1 includes the semiconductor pillars PL1 and PL2, respectively. Each of the semiconductor pillars PL1 and PL2 penetrates the plurality of string selection lines SSL1 and SSL0, the word lines WL, and the ground selection line GSL. Each of the semiconductor pillars PL1 and PL2 includes a dopant region (e.g. a drain region D) formed in an upper portion thereof. The drain region D is adjacent to the bit line BL. Each of the semiconductor pillars PL1 and PL2 is formed in a pipe shape, hollow cylindrical shape, or cup shape. And an insulating material fills an empty region defined by each of the semiconductor pillars PL1 and PL2.

In an embodiment, the memory cells MC of each of the cell strings STR1 and STR2 are realized by the word lines WL vertically stacked, each of the semiconductor pillars PL1 and PL2, and a data storage layer DS disposed between the word lines WL and each of the semiconductor pillars PL1 and PL2. Gate electrodes of the memory cells MC, which are disposed at substantially the same distance from the substrate 100, are connected in common to one of the word lines WL to be in an equipotential state.

The first and second string selection transistor units SST0 and SST1 of each of the cell strings STR1 and STR2 are realized by the first and second string selection lines SSL0 and SSL1, each of the semiconductor pillars PL1 and PL2, and the data storage layer DS between the string selection lines SSL0 and SSL1 and each of the semiconductor pillars PL1 and PL2. For realizing the first and second string selection transistor units SST0 and SST1 having the threshold voltages different from each other, first and second semiconductor pillars PL1 and PL2 include channel dopant regions CIR. The channel dopant regions CIR are included in portions of respective corresponding semiconductor pillars PL1 and PL2.

In an embodiment, the first string selection line SSL0 includes selection lines SSL0a and SSL0b vertically stacked. The selection lines SSL0a and SSL0b of the first string selection line SSL0 are also referred to as "first selection lines SSL0a and SSL0b". The first selection lines SSL0a and SSL0b are electrically connected to each other to be in an equipotential state. The second string selection line SSL1 includes selection lines SSL0a and SSL1b vertically stacked. The selection lines SSL1a and SSL1b of the second string selection line SSL1 are also referred to as "second selection lines SSL1a and SSL1b". The second selection lines SSL1a and SSL1b are electrically connected to each other to be in an equipotential state. Each of the first and second string selection transistor units SST0 and SST1 includes two field effect transistors of which gate electrodes are connected to each other.

In an embodiment, a vertical distance between the word lines WL is less than a thickness of each of the word lines WL. A thickness T of each of the first selection lines SSL0a and SSL0b is substantially equal to a thickness of each of the word lines WL. A vertical distance $D_1$ between the first selection lines SSL0a and SSL0b is equal to or less than a thickness of each of the word lines WL. A thickness of each of the second selection lines SSL0a and SSL1b is substantially equal to a thickness of each of the word lines WL. A vertical distance between the second selection lines SSL1a and SSL1b is equal to or less than a thickness of each of the word lines WL. A vertical distance $D_2$ between the first string selection line SSL0 and the second string selection line SSL1 is greater than the vertical distance $D_1$ between the first selection lines SSL0a and SSL0b. The vertical distance $D_2$ between the first and second string selection lines SSL0 and SSL1 is substantially equal to or greater than a vertical distance between the word lines WL.

The ground selection transistor unit GST of each of the cell strings STR1 and STR2 is realized by the ground selection line GSL, each of the semiconductor pillars PL1 and PL2, and the data storage layer DS between the ground selection line GSL and each of the semiconductor pillars PL1 and PL2. In an embodiment, the ground selection line GSL includes selection lines vertically stacked, and the selection lines of the ground selection line GSL are electrically connected to each other to be in an equipotential state. The ground selection transistor unit GST includes two field effect transistors of which gate electrodes are connected to each other. Each of the selection lines of the ground selection line GSL has substantially the same thickness as a thickness of each of the word lines WL. A vertical distance between the selection lines of the ground selection line GSL is equal to or less than a thickness of each of the word lines WL.

In an embodiment, the data storage layer DS includes a vertical insulating layer VI and a horizontal insulating layer HI. The vertical insulating layer VI covers a sidewall of each of the semiconductor pillars PL1 and PL2. The horizontal insulating layer HI is extended from between the vertical insulating layer VI and each of the lines GSL, WL, SSL0, and SSL1 onto a top surface and a bottom surface of each of the lines GSL, WL, SSL0, and SSL1. The data storage layer DS includes a tunnel insulating layer, a charge storage layer, and blocking insulating layers which are sequentially stacked between each of the semiconductor pillars PL1 and PL2 and each of the lines GSL, WL, SSL0, and SSL1. According to an embodiment, one of the horizontal insulating layer HI and the vertical insulating layer VI includes the charge storage layer. When the data storage layer DS includes the charge storage layer, data stored in the data storage layer DS may be changed by Fowler-Nordheim (F-N) tunneling induced by a voltage difference between each of the semiconductor pillars PL1 and PL2 and each of the word lines WL.

In an embodiment, the data storage layer DS includes a tunnel insulating layer, a floating gate electrode, and an inter-gate insulating layer which are sequentially stacked between each of the semiconductor pillars PL1 and PL2 and each of the lines GSL, WL, SSL0, and SSL1.

The data storage layer DS adjacent to the string selection lines SSL0 and SSL1 and the ground selection line GSL includes a gate insulating layer (e.g., a silicon oxide layer) for a general field effect transistor (FET).

In the 3D semiconductor memory device described above, the semiconductor pillars PL1 and PL2 are used as channel regions of field effect transistors (FET).

In more detail, the semiconductor pillars PL1 and PL2 are inverted by predetermined voltages applied to the first and second string selection lines SSL0 and SSL1, the word lines WL and the ground selection line GSL, thereby generating channel regions. The channel regions extend to the semiconductor pillars PL1 and PL2 between the lines GSL, WL, SSL0, and SSL1 adjacent to each other by a fringe electrical field generated from the lines GSL, WL, SSL0, and SSL1. According to an embodiment, a maximum length (or width) of each of the channel regions is greater than a thickness of each of the lines GSL, WL, SSL0, and SSL1. Thus, the channel regions generated in each of the semiconductor pillars PL1 and PL2 vertically overlap each other to form a current path electrically connecting the common source line CSL to a selected bit line BL.

For example, an electrical connection of the memory cells MC in each of the first and second cell strings STR1 and STR2 is realized by field effect source/drains. Surfaces of each of the semiconductor pillars PL1 and PL2 between the word lines WL are electrically connected to each other by the fringe electrical field.

In an embodiment, each of the first and second string selection transistor units SST0 and SST1 and the ground selection transistor unit GSL includes a plurality of field effect transistors of which gate electrodes are electrically connected to each other. According to an embodiment, when a predetermined voltage is applied in common to the first selection lines SSL0a and SSL0b, each of the semiconductor pillars PL1 and P12 adjacent to the first selection lines SSL0a and SSL0b is inverted to form a channel region. The channel region is extended to each of the semiconductor pillars PL1 and PL2 between the first selection lines SSL0a and SSL0b by the fringe electrical field generated from the voltage applied to the first selection lines SSL0a and SSL0b. A length of the channel region generated by the voltage applied to the first string selection line SSL0 is greater than a sum of thicknesses of the first selection lines SSL0a and SSL0b. Since an effective channel length of the first string selection transistor unit SST0 is increased, it is possible to suppress a short channel effect caused by high integration.

In the cell strings STR1 and STR2 connected in common to the bit line BL and sharing the string selection lines SSL0 and SSL1, the first and second string selection transistor units SST0 and SST1 have the threshold voltages different from each other. The 3D semiconductor memory device according to an embodiment of the inventive concept controls the threshold voltages of the first and second string selection transistor units vertically stacked.

FIGS. 12A, 12B, 13A, and 13B are cross-sectional views illustrating methods of controlling threshold voltages of string selection transistor units in a 3D semiconductor memory device according to embodiments of the inventive concept.

Hereinafter, a method of controlling the threshold voltages according to an embodiment will be described with reference to FIGS. 12A and 12B.

According to an embodiment, the method of controlling the threshold voltages includes controlling dopant concentrations of portions of the semiconductor pillars PL1 and PL2 adjacent to the first and second selection lines SSL0 and SSL1.

The first and second string selection transistor units SST0 and SST1 having the threshold voltages different from each other are connected to each of the first and second string selection lines SSL0 and SSL1. Each of the first and second cell strings STR1 and STR2 includes the first and second string selection transistor units SST0 and SST1 having the threshold voltages different from each other. Thus, a channel dopant region CIR is formed in a portion of a first semiconductor pillar PL1 adjacent to the second string selection line SSL1, and a channel region CIR is formed in a portion of a second semiconductor pillar PL2 adjacent to the first string selection line SSL0.

Figure 12A:
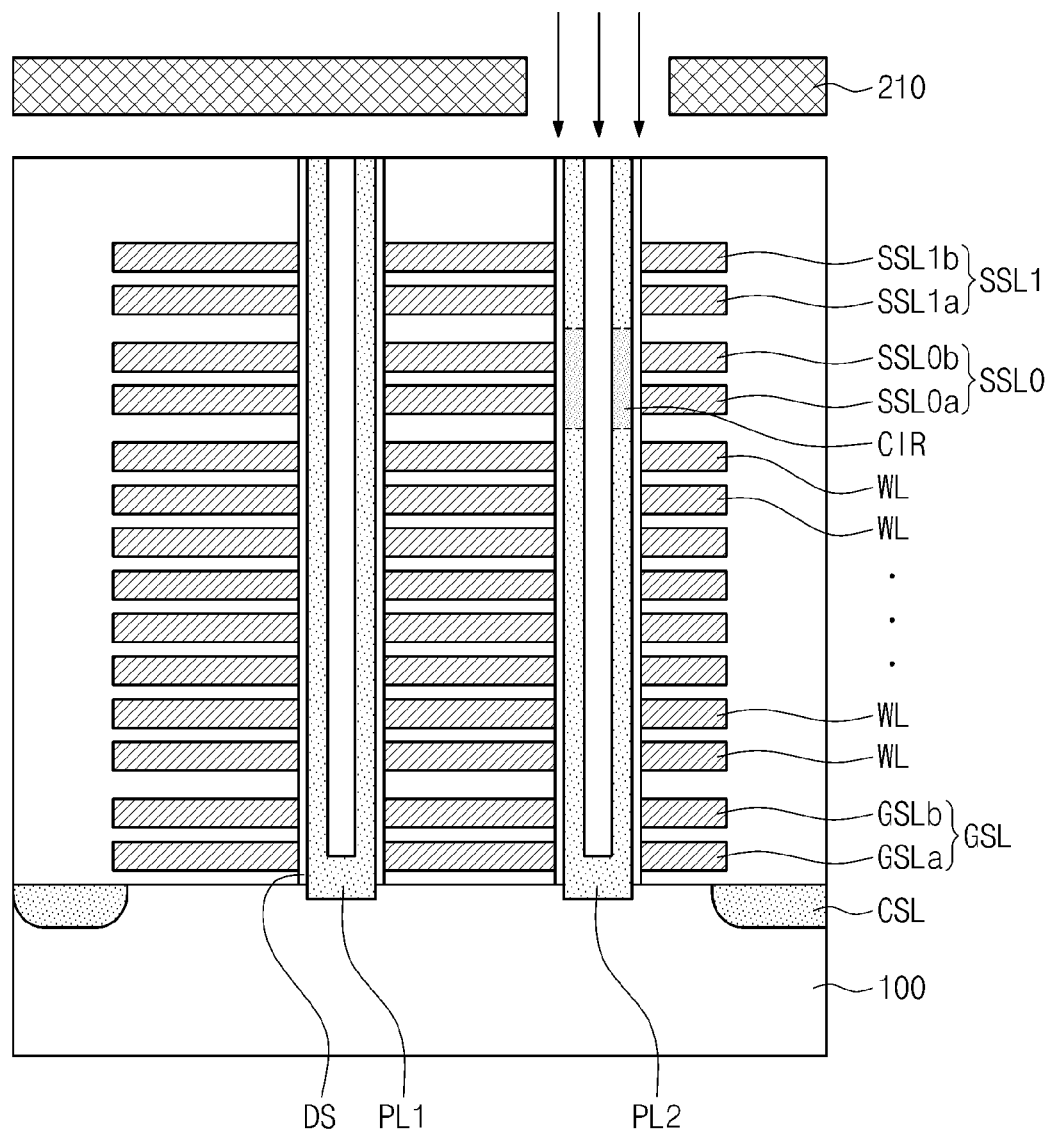
FIGS. 12A, 12B, 13A, and 13B are cross-sectional views illustrating methods of controlling threshold voltages of string selection transistor units in a 3D semiconductor memory device according to embodiments of the inventive concept.

In more detail, referring to FIG. 12A, the gate electrode structure and the first and second semiconductor pillars PL1 and PL2 are formed on the substrate 100. The gate electrode structure includes conductive lines GSL, WL, SSL0, and SSL1 vertically stacked on the substrate 100, and the first and second semiconductor pillars PL1 and PL2 penetrate the gate electrode structure. For example, the first and second semiconductor pillars PL1 and PL2 include silicon, germanium, or any combination thereof.

In an embodiment, the first and second semiconductor pillars PL1 and PL2 are formed of undoped poly-silicon (e.g., intrinsic semiconductor). When the channel dopant regions CIR are not formed in the first and second semiconductor pillars PL1 and PL2, the threshold voltages of the first and second string selection transistor units SST0 and SST1 are substantially equal to each other.

Figure 12B:
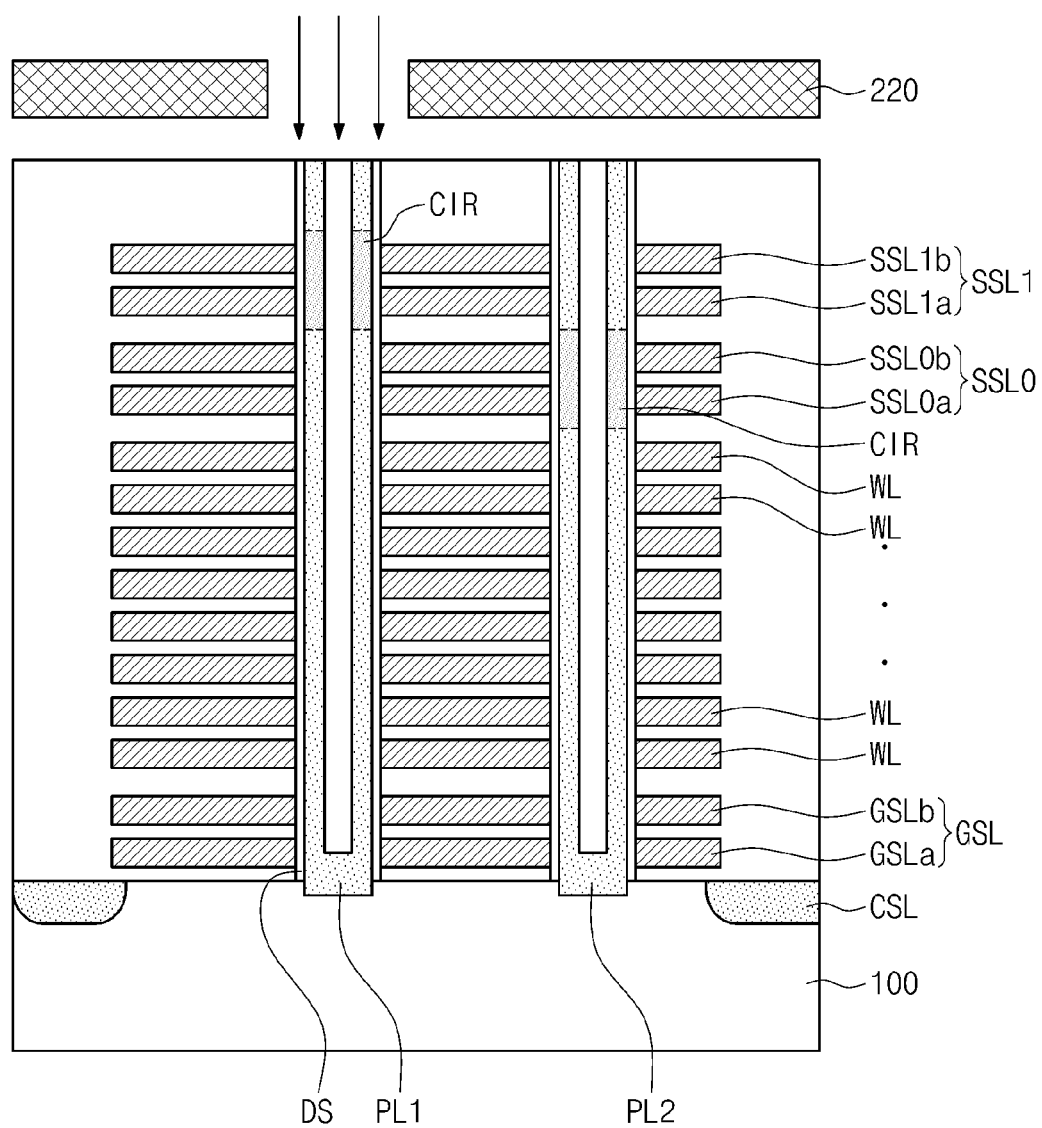

Forming the channel dopant regions CIR includes selectively performing a first ion implantation process on the second semiconductor pillar PL2 adjacent to the first string selection line SSL0 using a first mask 210, as illustrated in FIG. 12A, and selectively performing a second ion implantation process on the first semiconductor pillar PL1 adjacent to the second string selection line SSL1 using a second mask 220, as illustrated in FIG. 12B. According to an embodiment, the first ion implantation process implants first ions in the second semiconductor pillar PL2 adjacent to the first string selection line SSL0, and the second ion implantation process implants second ions in the first semiconductor pillar PL1 adjacent to the second string selection line SSL1. According to an embodiment, the channel dopant region CIR is formed by implanting N-type dopant ions or P-type dopant ions.

Since the first and second ion implantation processes are performed, a dopant concentration of the first semiconductor pillar PL1 adjacent to the first string selection line SSL0 is different from a dopant concentration of the second semiconductor pillar PL2 adjacent to the first string selection line SSL0. In other words, the first and second string selection transistor units SST0 and SST1 respectively having the threshold voltages different from each other are realized by the first string selection line SSL0 and the first and second semiconductor pillars PL1 and PL2.

In an embodiment, when a threshold voltage of the first string selection transistor unit SST0 is higher than a threshold voltage of the second string selection transistor unit SST1, P-type dopant ions are implanted into the undoped first and second semiconductor pillars PL1 and PL2 to form the channel dopant regions CIR.

Since the channel dopant regions CIR are formed at different depths in the first and second semiconductor pillars PL1 and PL2 by the ion implantation processes, threshold voltages of the first string selection transistor units SST0 included in the first and second cell strings STR1 and STR2 are different from each other.

In an embodiment, P-type dopant ions are implanted into the semiconductor pillars PL1 and PL2 doped with N-type dopants, thereby forming the channel dopant regions CIR. According to an embodiment, each of the first and second semiconductor pillars PL1 and PL2 includes channel regions which are respectively adjacent to the first and second string selection lines SSL0 and SSL1 and which have conductivity types different from each other. Since the channel regions of the first and second string selection transistor units SST0 and SST1 have the conductivity types different from each other, it is possible to increase a difference between the threshold voltages of the first and second string selection transistor units SST0 and SST1.

In an embodiment, when the first threshold voltage of the first string selection transistor unit SST0 is lower than the second threshold voltage of the second string selection transistor unit SST1, N-type dopant ions are implanted into the channel dopant region CIR.

A method of controlling the threshold voltages according to an embodiment is described with reference to FIGS. 13A and 13B.

According to an embodiment, a method of controlling the threshold voltages includes controlling the threshold voltages of the string selection transistor units SST0 and SST1, which are controlled by the first string selection line SSL0, through an electrical method and controlling dopant concentrations of the semiconductor pillars PL1 and PL2 adjacent to the second string selection line SSL1.

Figure 13A:
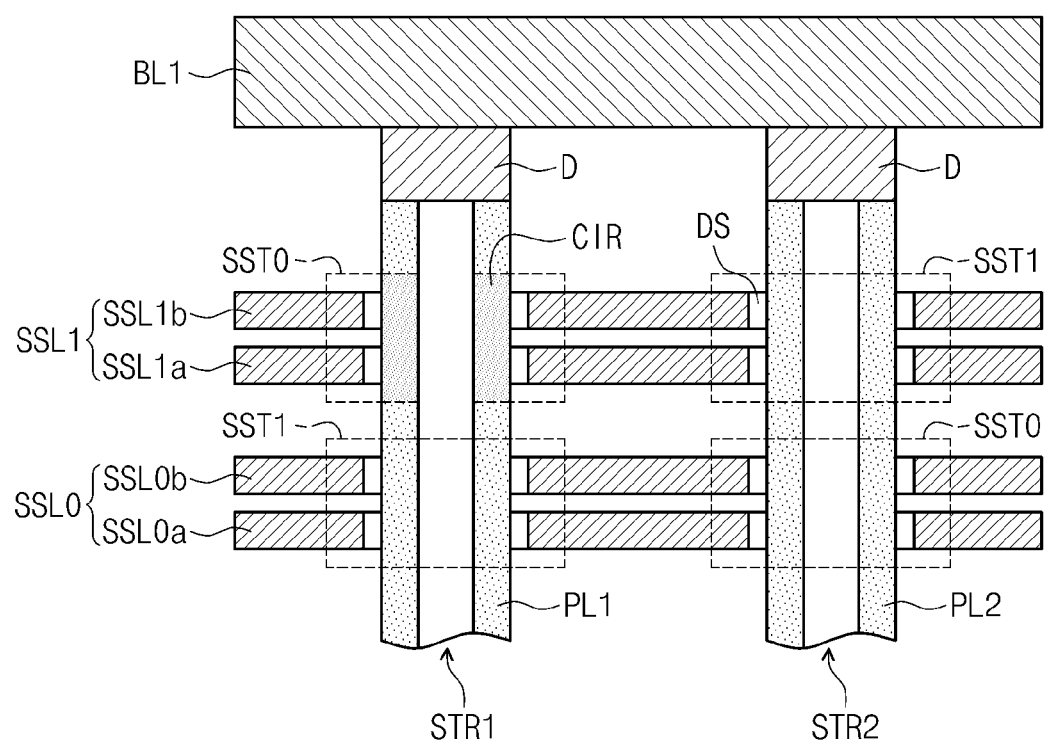
Figure 13B:
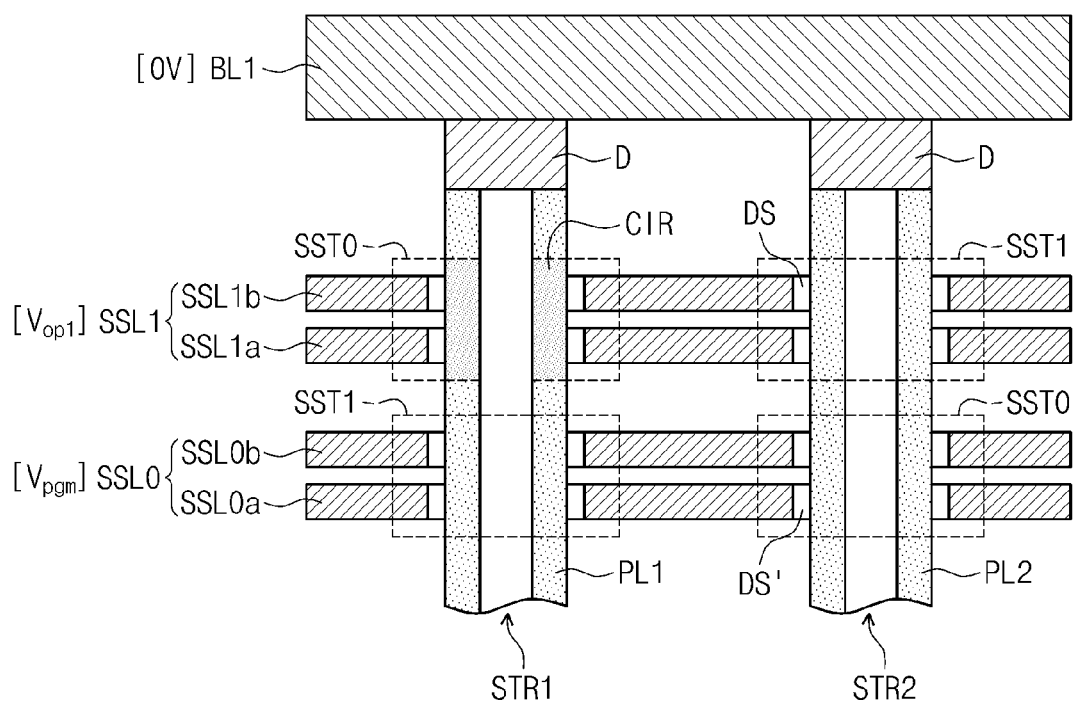

In more detail, as illustrated in FIG. 13A, the 3D semiconductor memory device includes a channel dopant region CIR formed in a portion of the first semiconductor pillar PL1 adjacent to the second string selection line SSL1. According to an embodiment, the channel dopant region CIR is formed by implanting N-type or P-type dopant ions into the first semiconductor pillar PL1.

In the 3D semiconductor memory device illustrated in FIG. 13A, the first and second string selection transistor units SST0 and SST1 controlled by the first string selection line SSL0 have the same threshold voltage. The threshold voltages of the first and second string selection transistor units SST0 and SST1 controlled by the second string selection line SSL1 are different from each other by the channel dopant region CIP. For example, the threshold voltage of the first string selection transistor unit SST0 realized by the second string selection line SSL1 and the first semiconductor pillar PL1 is greater than the threshold voltage of the second string selection transistor unit SST1 realized by the second string selection line SSL1 and the second semiconductor pillar PL2. The data storage layer DS, which is the same or substantially the same as data storage layers of the memory cells MC is disposed between the string selection lines SSL0 and SSL1 and the semiconductor pillars PL1 and PL2.

The threshold voltages of the first and second string selection transistor units SST0 and SST1 controlled by the first string selection line SSL0 are controlled by an electrical method. In more detail, a voltage condition as illustrated in FIG. 13B is applied to the 3D semiconductor memory device. The voltage condition increases the threshold voltage of the first string selection transistor unit SST0 realized by the first string selection line SSL0 and the second semiconductor pillar PL2.

In more detail, a ground voltage (0V) is applied to the bit line BL, the ground selection line GSL, and the common source line CSL. A first operation voltage Vop1 less than the first threshold voltage and greater than the second threshold voltage is applied to the second string selection line SSL1. Thus, the string selection transistor unit SST0 realized by the second string selection line SSL1 and the first semiconductor pillar PL1 is turned off, and the string selection transistor unit SST1 realized by the second string selection line SSL1 and the second semiconductor pillar PL2 is turned on.

A program voltage Vpgm is applied to the first string selection line SSL0, and pass voltages Vpass are applied to the word lines WL. The program voltage Vpgm is selected from a range capable of inducing the F-N tunneling of charges from the semiconductor pillars PL1 and PL2 to the data storage layer DS. The pass voltages Vpass are selected from a range less than the program voltage Vpgm and greater than the threshold voltages of the memory cells MC.

Since the string selection transistor unit SST1 realized by the second string selection line SSL1 and the second semiconductor pillar PL2 is turned on under the voltage condition described above, the second string STR2 is electrically connected to the bit line BL. The program voltage Vpgm is applied to the first string selection line SSL0, so that charges are trapped into the data storage layer DS' adjacent to the first string selection line SSL0 from the second semiconductor pillar PL2. The charges trapped in the data storage layer DS' may increase the threshold voltage of the string selection transistor unit SST0 realized by the first string selection line SSL0 and the second semiconductor pillar PL2. According to an embodiment, the threshold voltage determined by the program voltage is controlled to be substantially equal to the threshold voltage of the string selection transistor unit SST0 having the channel dopant region CIR.

The string selection transistor unit SST realized by the second string selection line SSL1 and the first semiconductor pillar PL1 is turned off, so that the cell string STR1 is electrically isolated from the bit line BL. Thus, it is possible to prevent the threshold voltage of the string selection transistor unit SST1 realized by the first semiconductor pillar PL1 and the first string selection line SSL0 from being changed.

In an embodiment, all the threshold voltages of the first and second string selection transistor units SST0 and SST1 are controlled by electrical methods.

Figure 5:
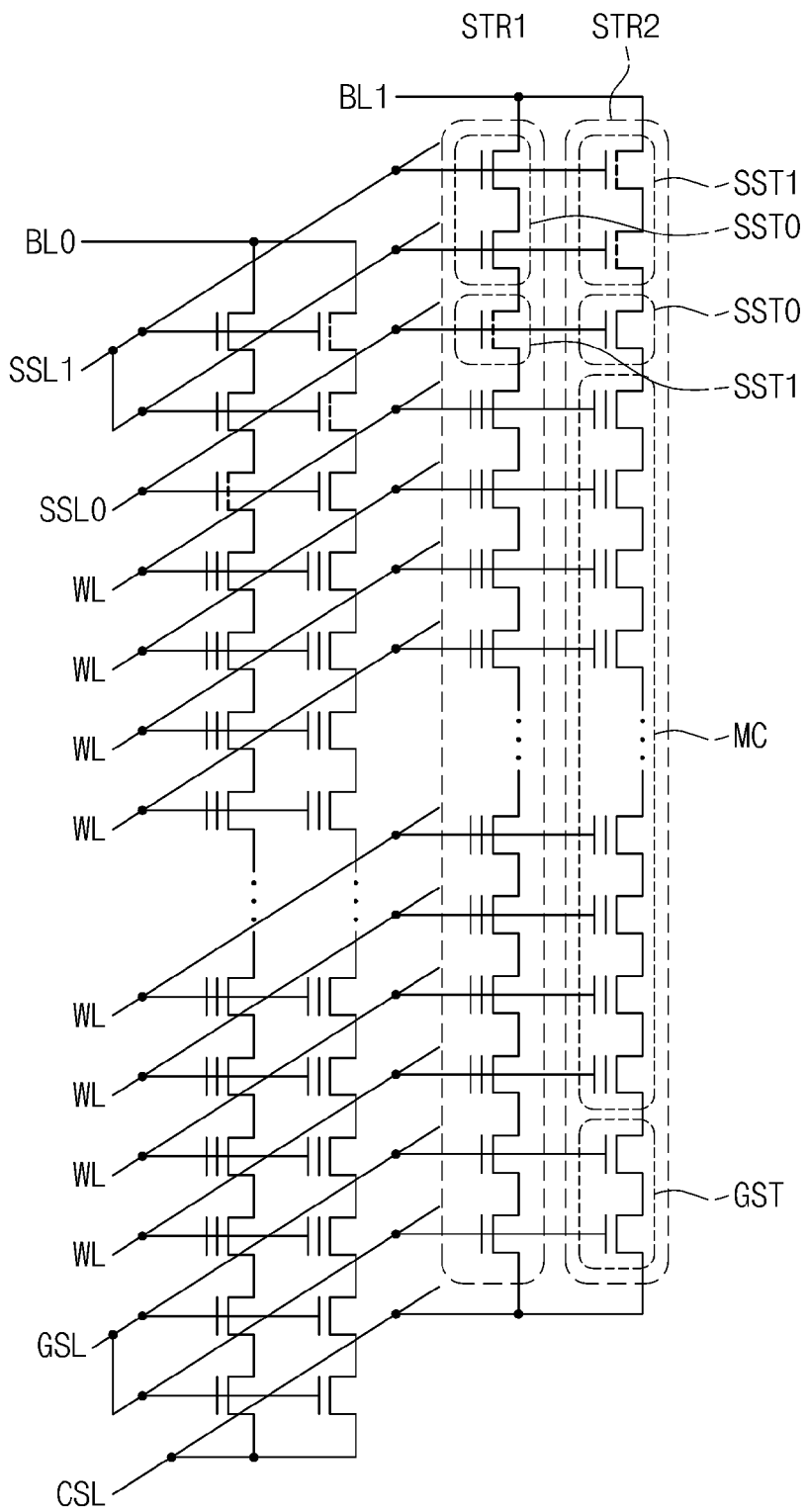
FIG. 5 is a circuit diagram illustrating a 3D semiconductor memory device according to an embodiment of the inventive concept.
Figure 6:
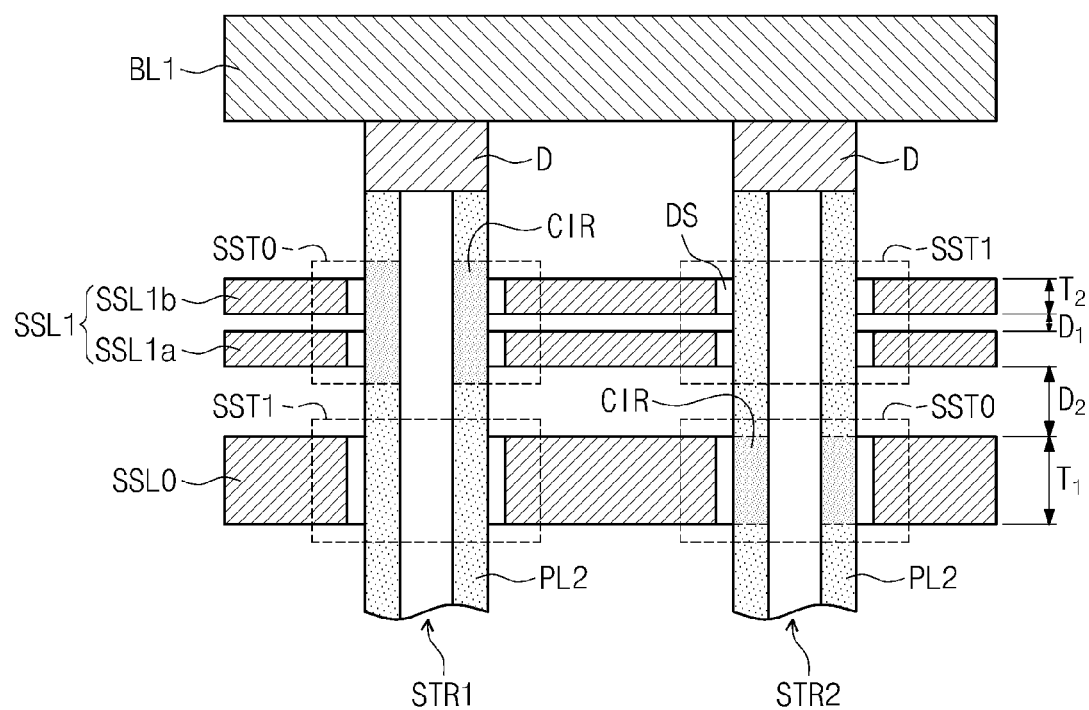
FIG. 6 is a cross-sectional view illustrating a portion of a 3D semiconductor memory device according to an embodiment of the inventive concept.

FIG. 5 is a circuit diagram illustrating a 3D semiconductor memory device according to an embodiment of the inventive concept. FIG. 6 is a cross-sectional view illustrating a portion of a 3D semiconductor memory device according to an embodiment of the inventive concept.

A 3D semiconductor memory device according to an embodiment includes substantially the same technical characteristics as the 3D semiconductor memory device described in connection with FIGS. 1 to 4 except the structures of first and second string selection lines SSL0 and SSL1.

According to an embodiment, each of string selection transistor units adjacent to the bit line BL includes a plurality of field effect transistors. Thus, an effective channel length of the string selection transistor unit adjacent to the bit line BL is increased, thereby suppressing an electrical leakage between the cell string and the bit line BL.

In more detail, referring to FIGS. 5 and 6, a first string selection line SSL0 includes one conductive line, and a second string selection line SSL1 adjacent to the bit line BL includes two second selection lines SSL1a and SSL1b. According to an embodiment, a thickness $T_1$ of the first string selection line SSL0 is greater than a thickness $T_2$ of each of the second selection lines SSL1a and SSL1b. A vertical distance $D_1$ between the second selection lines SSL1a and SSL1b is substantially equal to or less than a thickness $T_2$ of each of the second selection lines SSL1a and SSL1b. A vertical distance $D_2$ between the first string selection line SSL0 and the second string selection line SSL1 is greater than the vertical distance $D_1$ between the second selection lines SSL1a and SSL1b.

Alternatively, unlike the 3D semiconductor memory device illustrated in FIGS. 5 and 6, each of the string selection transistor units adjacent to the bit line BL includes one field effect transistor, and the string selection transistor unit adjacent to the memory cell includes a plurality of field effect transistors.

Figure 7:
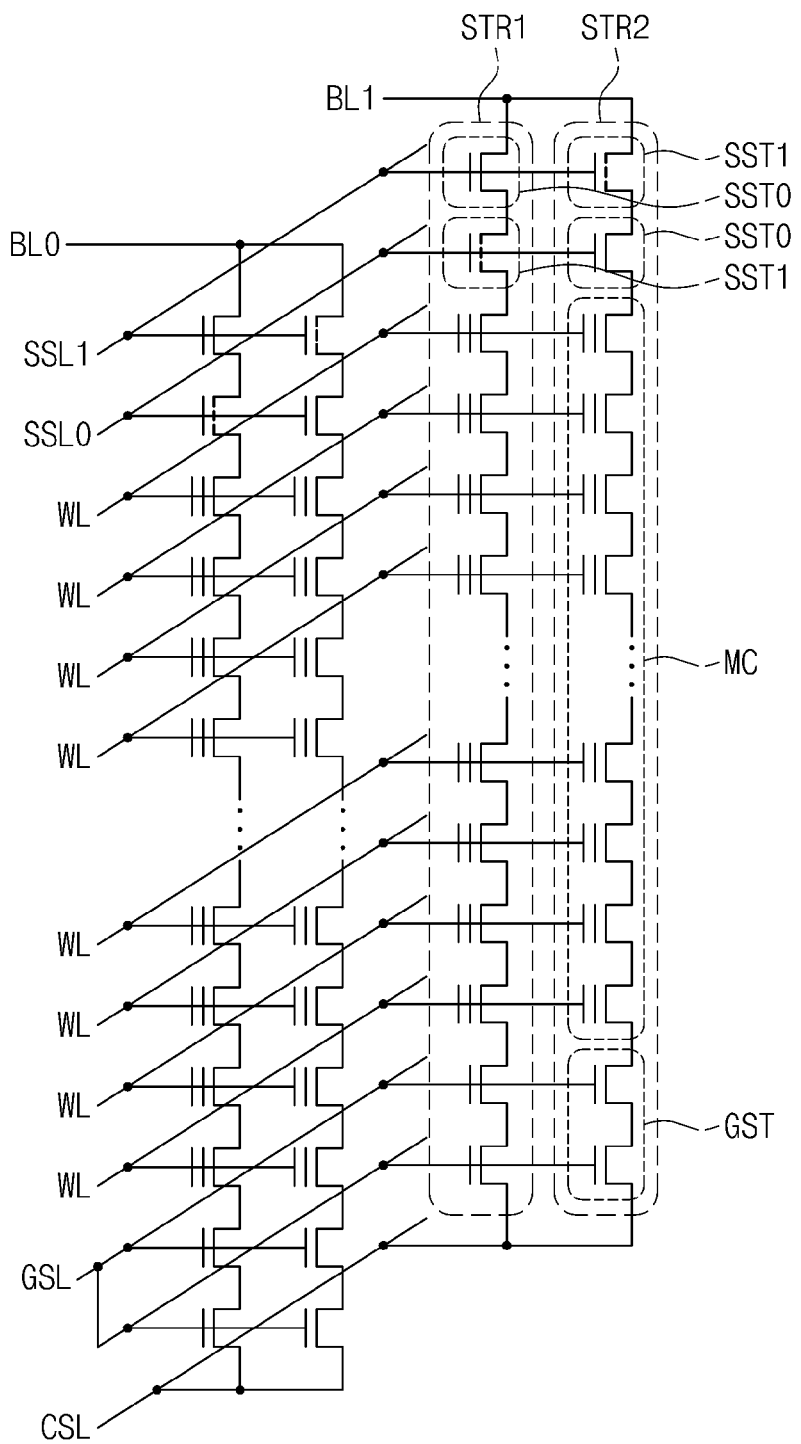
FIG. 7 is a circuit diagram illustrating a 3D semiconductor memory device according to an embodiment of the inventive concept.
Figure 8:
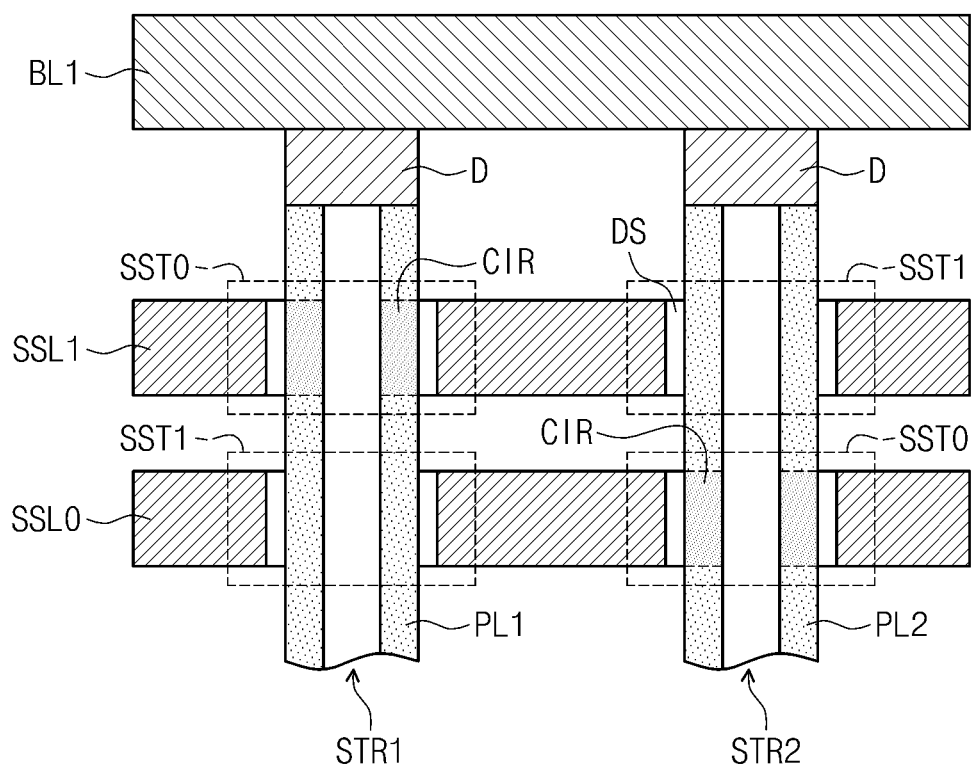
FIG. 8 is a cross-sectional view illustrating a portion of a 3D semiconductor memory device according to an embodiment of the inventive concept.

FIG. 7 is a circuit diagram illustrating a 3D semiconductor memory device according to an embodiment of the inventive concept. FIG. 8 is a cross-sectional view illustrating a portion of a 3D semiconductor memory device according to an embodiment of the inventive concept.

A 3D semiconductor memory device according to an embodiment includes substantially the same technical characteristics as the 3D semiconductor memory device described in connection with FIGS. 1 to 4 except the structures of first and second string selection lines SSL0 and SSL1.

In more detail, referring to FIGS. 7 and 8, each of first and second string selection transistor units SST0 and SST1 includes one field effect transistor. In other words, each of first and second string selection lines SSL0 and SSL1 includes one conductive line. In the case that each of the first and second string selection lines SSL0 and SSL1 includes one conductive line, a thickness of each of the first and second string selection lines SSL0 and SSL1 is greater than a thickness of each of the word lines WL.

Figure 9:
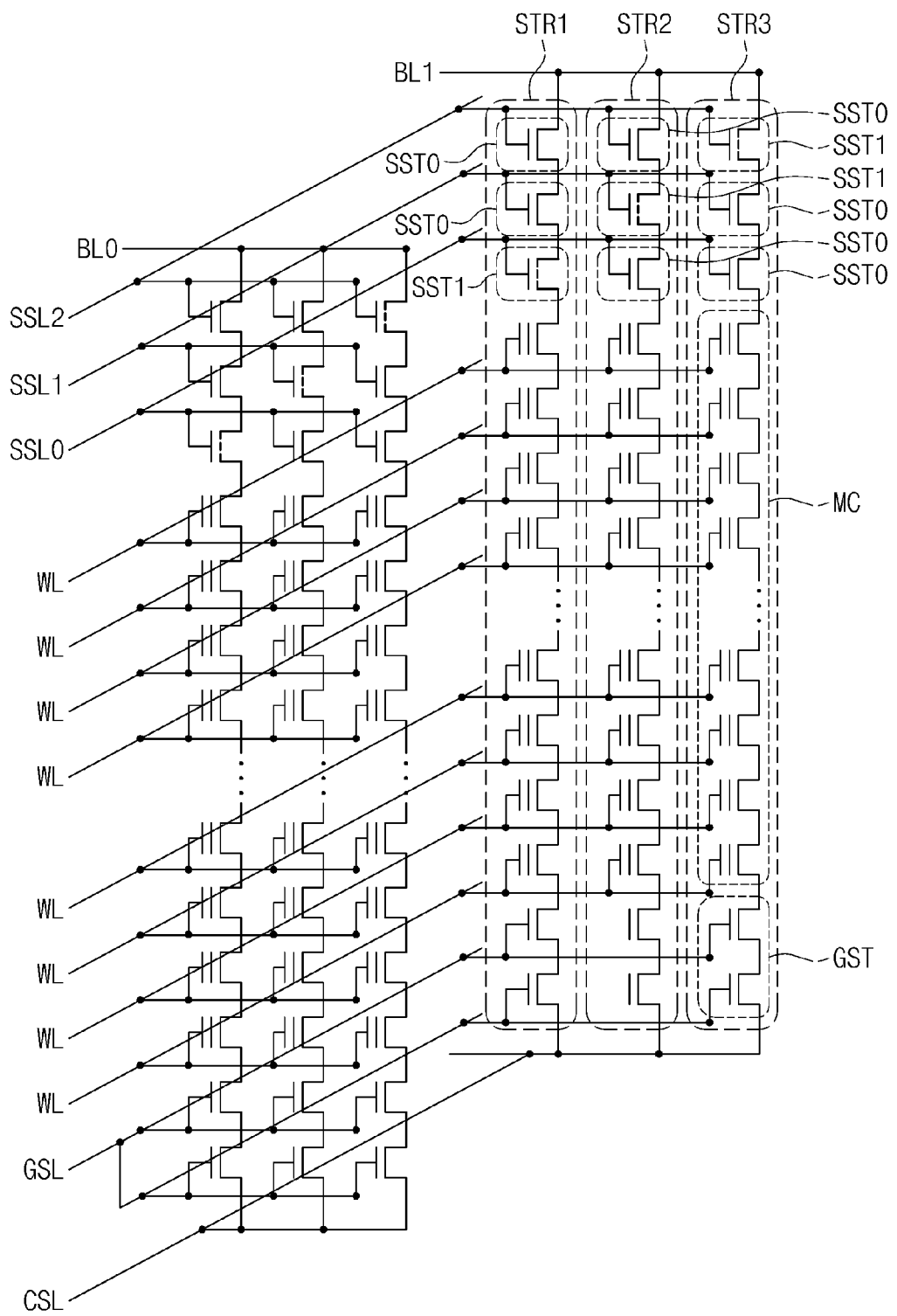
FIG. 9 is a circuit diagram illustrating a 3D semiconductor memory device according to an embodiment of the inventive concept.
Figure 10:
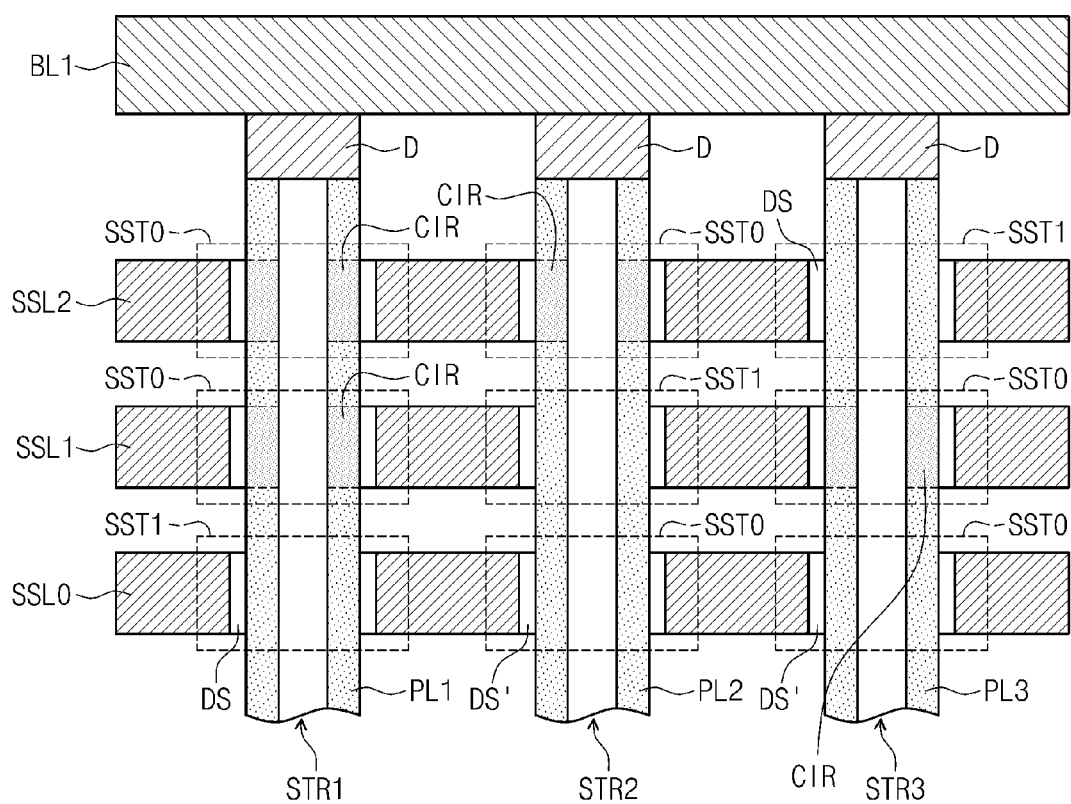
FIG. 10 is a cross-sectional view illustrating a portion of a 3D semiconductor memory device according to an embodiment of the inventive concept.
Figure 11:
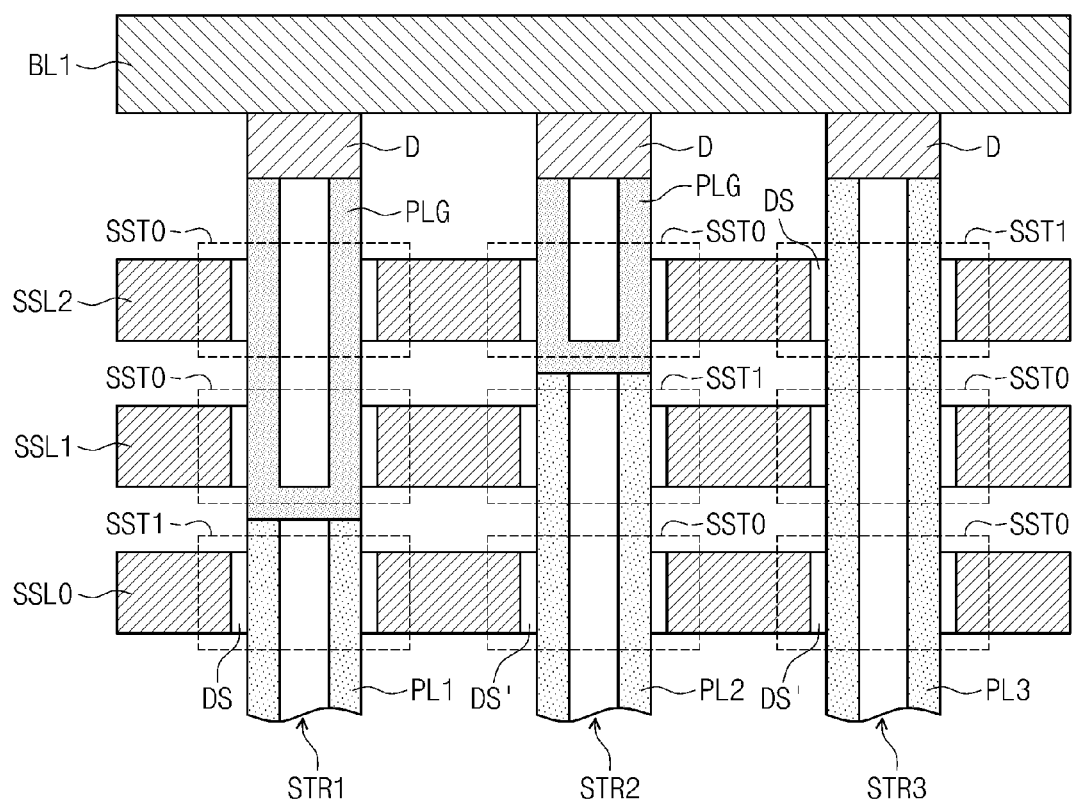
FIG. 11 is a cross-sectional view illustrating a 3D semiconductor memory device according to an embodiment of the inventive concept.

FIG. 9 is a circuit diagram illustrating a 3D semiconductor memory device according to an embodiment of the inventive concept. FIG. 10 is a cross-sectional view illustrating a portion of a 3D semiconductor memory device according to an embodiment of the inventive concept. FIG. 11 is a cross-sectional view illustrating a 3D semiconductor memory device according to an embodiment of the inventive concept.

A 3D semiconductor memory device according to an embodiment includes substantially the same technical characteristics as the 3D semiconductor memory device described in connection with FIGS. 1 to 4. In the 3D semiconductor memory device according to an embodiment, first, second, and third cell strings STR1, STR2, and STR3 share the bit line BL and string selection lines SSL0, SSL1, and SSL2. In an embodiment, each of the cell strings STR1, STR2, and STR3 includes a string selection element connected to the bit line BL, a ground selection element connected to the common source line CSL, and a plurality of memory cells MC connected in series between the string selection element and the ground selection element. The string selection element includes a plurality of string selection transistor units SST0 and SST1 connected in series to each other. The number of the string selection transistor units SST0 and SST1 of the string selection element is equal to or greater than the number of the cell strings STR1, STR2, and STR3 connected in common to one bit line BL. One of the string selection transistor units SST0 and SST1 of the string selection element has a threshold voltage different from threshold voltages of the others of the string selection transistor units SST0 and SST1 of the string selection element.

Each of the first to third cell strings STR1, STR2, and STR3 includes a plurality of string selection transistor units SST0 and SST1 connected in series to each other, and a threshold voltage of one of the string selection transistor units SST0 and SST1 is different from threshold voltages of the others of the string selection transistor units SST0 and SST1. In more detail, each of the cell strings STR1, STR2, and STR3 includes first and second string selection transistor units SST0 and SST1. According to an embodiment, a plurality of first string selection transistor units SST0 are provided in their corresponding cell string. Alternatively, a plurality of string selection transistor units SST1 are provided in their corresponding cell string. The first string selection transistor unit SST0 has a first threshold voltage, and the second string selection transistor unit SST1 has a second threshold voltage less than the first threshold voltage. In an embodiment, each of the cell strings STR1, STR2, and STR3 includes one second string selection transistor unit SST1. The second string selection transistor units SST1 are respectively connected to first, second, and third string selection lines SSL0, SSL1, and SSL2 shared by the first to third cell strings STR1, STR2, and STR3.

In an embodiment, each of the first to third string selection lines SSL0, SSL1, and SSL2 includes one conductive line as illustrated in FIGS. 9 and 10. However, the embodiments of the inventive concept are not limited thereto. In an embodiment, each of the first to third string selection lines SSL0, SSL1, and SSL2 includes a plurality of conductive lines as described in connection with FIGS. 1 to 4.

According to an embodiment as illustrated in FIG. 10, P-type dopant ions are selectively implanted into the first to third semiconductor pillars PL1, PL2, and PL3 to form channel dopant regions CIR. Thus, the first string selection transistor units SST0, which have the first threshold voltages higher than the second threshold voltage, are realized. Alternatively, N-type dopant ions are selectively implanted into the first to third semiconductor pillars PL1, PL2, and PL3, thereby forming the first string selection transistor units SST0 having the first threshold voltages lower than the second threshold voltage.

According to an embodiment, semiconductor plugs PLG doped with N-type or P-type dopants are formed on the first to third semiconductor pillars PL1, PL2, and PL3, respectively, for controlling the threshold voltages of the first and second string selection transistor units SST0 and SST1. According to an embodiment, the semiconductor plugs PLG are formed on the first and second semiconductor pillars PL1 and PL2, respectively, as shown in FIG. 11. Vertical lengths of the semiconductor plugs PLG are different from each other.

In an embodiment, the semiconductor plugs PLG are formed of a semiconductor material doped with P-type dopants. When the semiconductor plug PLG on the first semiconductor pillar PL1 penetrates the third and second string selection lines SSL2 and SSL1, the first string selection transistor units SST0 of the first cell string STR1 are realized by the second and third string selection lines SSL1 and SSL2 and the semiconductor plug PLG on the first semiconductor pillar PL1. When the semiconductor plug PLG on the second semiconductor pillar PL2 penetrates the third string selection line SSL2, the first string selection transistor unit SST0 of the second cell string STR2 is realized by the third string selection line SSL2 and the semiconductor plugs PLG on the second semiconductor pillar PL2.

In an embodiment, the threshold voltages of the first and second string selection transistor units SST0 and SST1 are controlled by dopant ion implantation processes and by an electrical method as described with reference to FIGS. 13A and 13B. In other words, a program voltage is applied to the first string selection line SSL0 adjacent to the word line WL, so that charges are selectively injected into data storage layers DS'.

According to an embodiment, a selected bit line BL is electrically connected to one of the first to third cell strings STR1, STR2, and STR3 by a voltage condition selectively turning on the first and second selection transistor units SST0 and SST1 included in the cell strings STR1, STR2, and STR3.

For example, when the third cell string STR3 of the cell strings STR1, STR2, and STR3 connected in common to the selected bit line BL is selected, a first operation voltage Vop1 greater than the first and second threshold voltages is applied to the first and second string selection lines SSL0 and SSL1. A second operation voltage Vop2 greater than the second threshold voltage and less than the first threshold voltage is applied to the third string selection line SSL2. The first string selection transistor units SST0 of non-selected first and second cell strings STR1 and STR2 are turned off by the second operation voltage Vop2. Thus, the first and second cell strings STR1 and STR2 are electrically isolated from the selected bit line BL.

Figure 14:
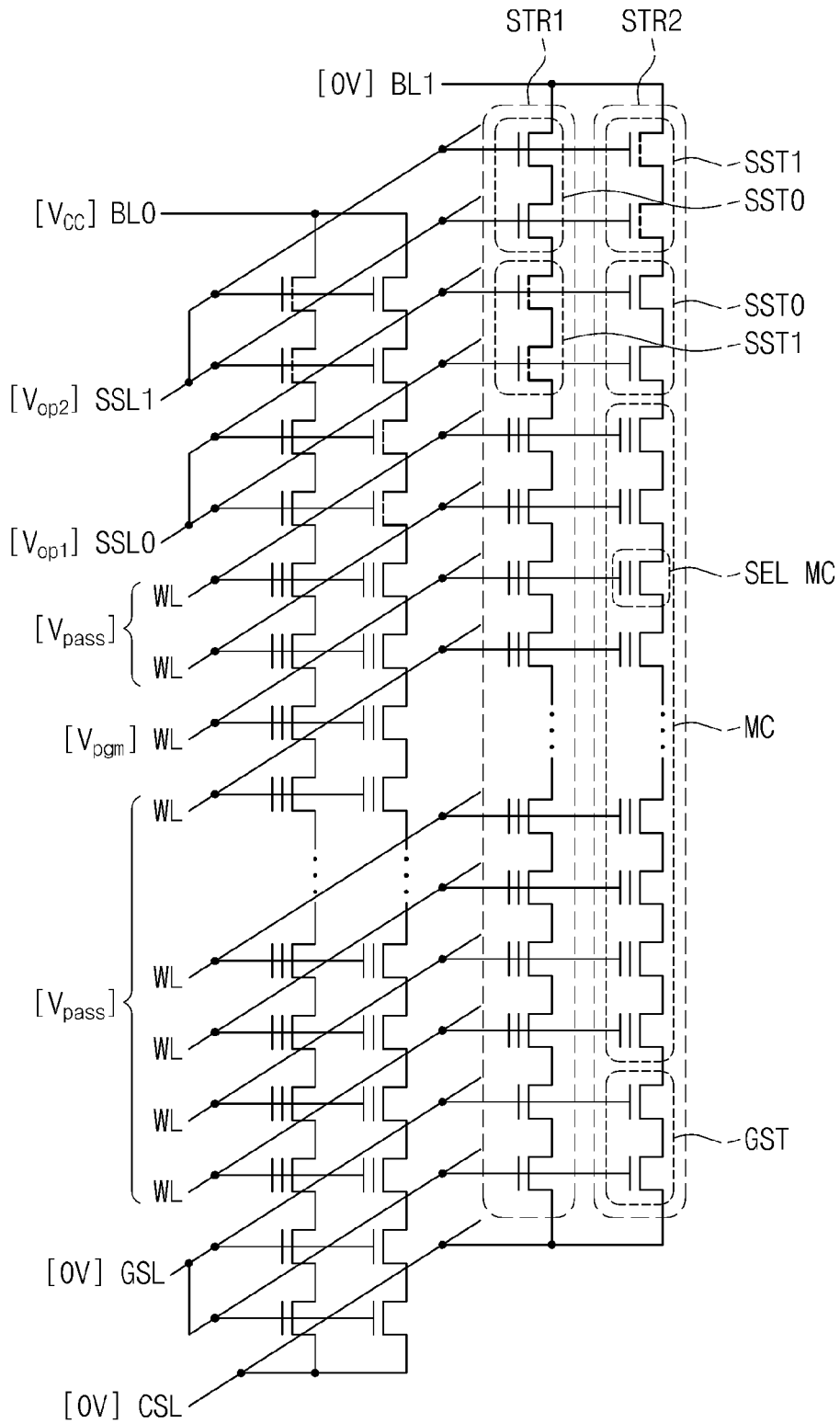
FIGS. 14 to 16 are circuit diagrams illustrating methods of operating a 3D semiconductor memory device according to some embodiments of the inventive concept.
Figure 15:
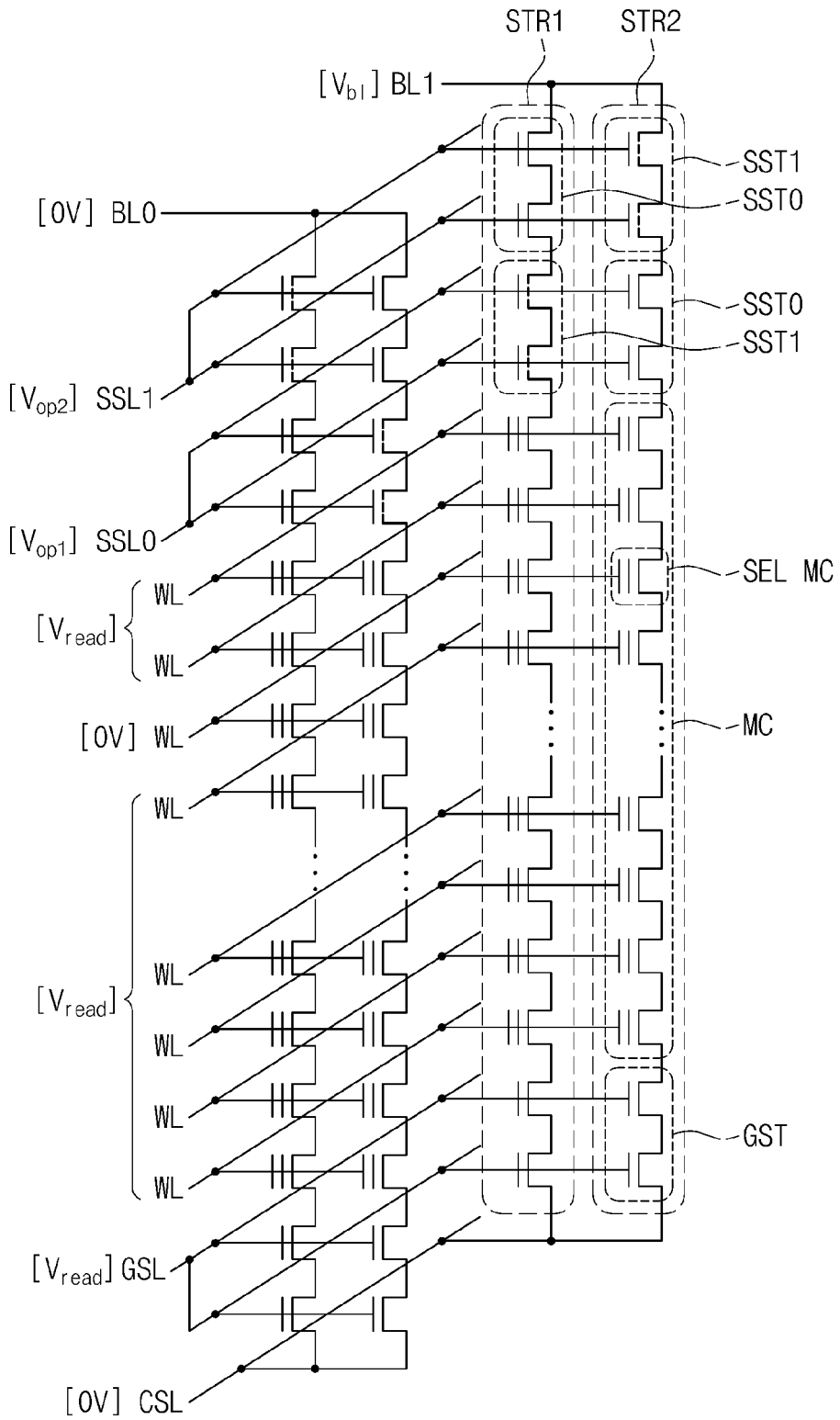
Figure 16:
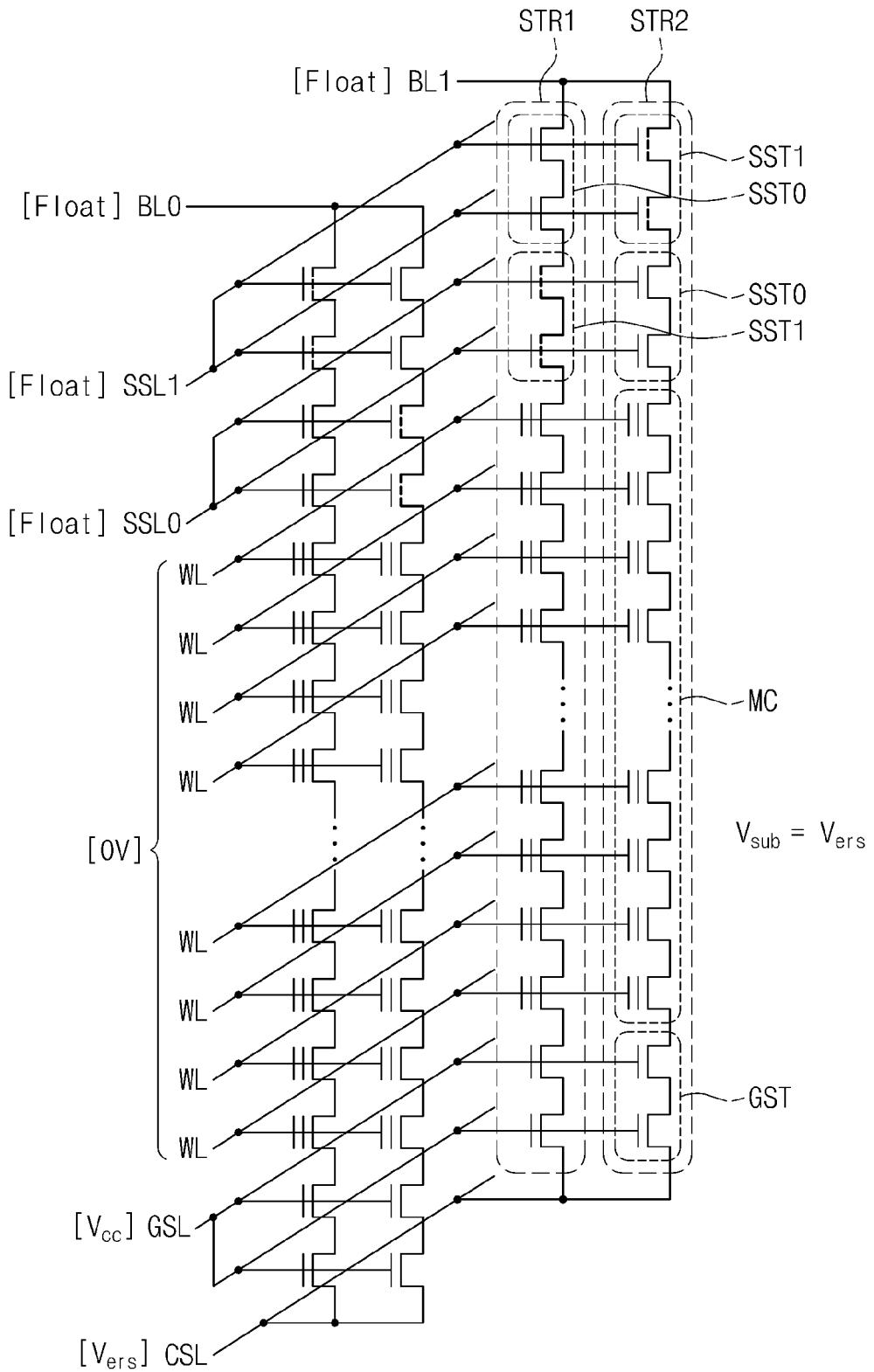

FIGS. 14 to 16 are circuit diagrams illustrating methods of operating a 3D semiconductor memory device according to some embodiments of the inventive concept. In more detail, FIGS. 14 to 16 are circuit diagrams to describe a program operation, a read operation, and an erasing operation, respectively. The operation methods are described using the 3D semiconductor memory device described in connection with FIGS. 1 to 4 as an example. The operation methods apply in the same or similar way to the 3D semiconductor memory devices described in connection with FIGS. 5 to 11.

According to an embodiment, the first string selection transistor unit SST0 has the first threshold voltage Vth1, and the second selection transistor unit SST1 has the second threshold voltage Vth2 less than the first threshold voltage Vth1 (e.g., Vth1>Vth2). The first and second string selection transistor units SST0 and SST1 are turned on by the first operation voltage Vop1. In other words, the first operation voltage Vop1 is greater than the first and second threshold voltages Vth1 and Vth2 (e.g., Vop1>Vth1, Vop1>Vth2). The first string selection transistor unit SST0 is turned off by the second operation voltage Vop2, and the second string selection transistor unit SST1 is turned on by the second operation voltage Vop2. In other words, the second operation voltage Vop2 is greater than the second threshold voltage Vth2 and less than the first threshold voltage Vth1 (e.g., Vth1>Vop2>Vth2).

Referring to FIG. 14, the program operation is performed by connecting one selected from a plurality of cell strings STR1 and STR2 to a selected bit line BL and by storing data in one memory cell MC in the selected cell string STR1 or STR2. For example, the second cell string STR2 is connected to the second bit line BL1, and the data is stored in a memory cell SEL MC selected from the memory cells MC included in the second cell string STR2.

In more detail, a ground voltage 0V is applied to the selected second bit line BL1, and a power voltage Vcc is applied to non-selected bit lines BL0. The ground selection line GSL and the common source line CSL are applied with the ground voltage 0V. A program voltage Vpgm is applied to a selected word line, and a pass voltage Vpass is applied to non-selected word lines WL. The program voltage Vpgm is selected from a voltage range that can induce the F-N tunneling from the semiconductor pillar to the data storage layer in the selected memory cell SEL MC. The pass voltage Vpass is selected from a voltage range less than the program voltage Vpgm and greater than threshold voltages of the memory cells MC.

The first and second string selection lines SSL0 and SSL1 are applied with voltages capable of turning on the first and second selection transistor units SST0 and SST1 of the selected second cell string STR2.

In more detail, the first operation voltage Vop1 is applied to the first string selection line SSL0, and the second operation Vop2 is applied to the second string selection line SSL1. Thus, the first and second string selection transistor units SST0 and SST1 of the selected second cell string STR2 are turned on, so that the memory cells MC of the second cell string STR2 are connected to the second bit line BL1.

When the first operation voltage Vop1 is applied to the first string selection line SSL0, and the second operation voltage Vop2 is applied to the second string selection line SSL1, the first string selection transistor unit SST0 of the first cell string STR1 being non-selected is turned off. Thus, the cell string STR1 is electrically isolated from the common source line CSL and the second bit line BL1 to be electrically floated.

First cell strings STR1 connected to the non-selected bit lines BL0 are electrically isolated from the non-selected bit lines BL0 to be electrically floated. Second cell strings STR2 connected to the non-selected bit lines BL0 are self-boosted by the power voltage Vcc. Thus, it is possible to prevent the memory cells MC of the non-selected cell strings from being programmed.

Referring to FIG. 15, the second cell string STR2 is connected to the second bit line BL1, and stored data is read from a memory cell SEL MC selected from the memory cells MC of the second cell string STR2. The read operation is described using the 3D semiconductor memory device described in connection with FIGS. 1 to 4 as an example.

In more detail, a bit line voltage Vb1 of about 0.4V to about 0.9V is applied to the selected second bit line BL1, and the ground voltage 0V is applied to non-selected bit lines BL0. The ground voltage 0V is also applied to the common source line CSL. A read voltage Vread is applied to the ground selection line GSL, so that channels of the selected cell string STR2 are connected to the common source line CSL. A sensing voltage is applied to a selected word line WL. The sensing voltage includes the ground voltage 0V. The read voltage Vread is also applied to non-selected word lines WL. The read voltage Vread turns on non-selected memory cells MC.

Voltages are applied to the first and second string selection lines SSL0 and SSL1 to turn on all the string selection transistor units SST0 and SST1 of the second cell string STR2. For example, the first operation voltage Vop1 is applied to the first string selection line SSL0, and the second operation voltage Vop2 is applied to the second string selection line SSL1, thereby electrically connecting the second bit line BL1 to the second cell string STR2. The first selection transistor unit SST0 of the non-selected first cell string STR1 is turned off. Thus, the first cell string STR1 is electrically isolated from the second bit line BL1.

The selected memory cell SEL MC is turned on or turned off depending on data (e.g., logic 0 or logic 1) stored in the selected memory cell SEL MC. When the selected memory cell SEL MC is turned on, a current flow is generated through the selected second cell string STR2. Thus, a change in the current flowing through the second cell string STR2 is detected through the second bit line BL1.

Referring to FIG. 16, the erasing operation is performed by discharging the charges stored in the memory cells MC into the semiconductor pillars. In an embodiment, the erasing operation is performed by injecting charges whose polarity is different from the polarity of the charges stored in the memory cells MC into the memory cells MC. In an embodiment, the erasing operation is performed on one selected from the memory cells MC or is simultaneously performed on all the memory cells MC in a block.

Referring to FIG. 16, when the erasing operation is performed, voltages are applied to the first and second string selection lines SSL0 and SSL1 to electrically isolate all the cell strings STR1 and STR2 from all the bit lines BL0 and BL1. For example, all the string selection lines SSL0 and SSL1 are electrically floated and all the bit lines BL0 and BL1 are electrically floated. An erasing voltage Vers is applied to the common source line CSL, and the ground voltage 0V is applied to the word lines WL. A voltage Vcc capable of turning on the ground selection transistor units GST is applied to the ground selection line GSL. The erasing voltage Vers (e.g., about 18V to about 20V) is applied to the semiconductor pillars PL1 and PL2.

Then, charges stored in all the memory cells MC in the cell strings STR1 and STR2 are discharged into the semiconductor pillars PL1 and PL2 by the F-N tunneling.

Figure 17:
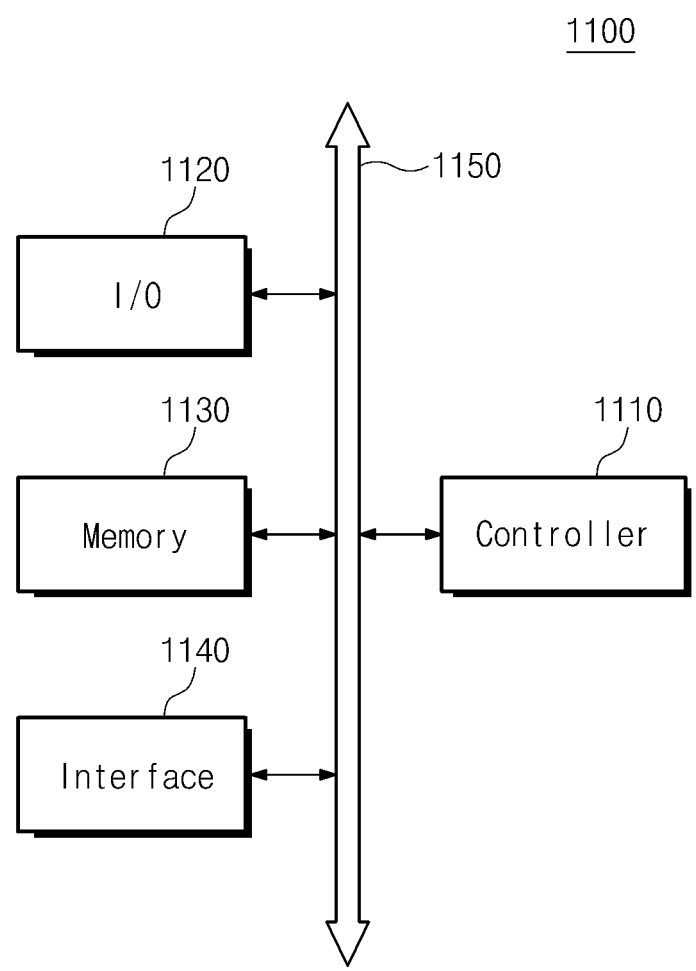
FIG. 17 is a schematic block diagram illustrating an example of a memory system including a 3D semiconductor memory device according to an embodiment of the inventive concept.

FIG. 17 is a schematic block diagram illustrating an example of a memory system including a 3D semiconductor memory device according to an embodiment of the inventive concept.

Referring to FIG. 17, a memory system 1100 can be applied to a PDA (personal digital assistant), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120, such as a keypad or a display device, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 is used to store an instruction executed by the controller 1110. The input/output device 1120 can receive data or a signal from a source outside of the information processing system 1100 or can transmit data or a signal to the source outside of the information processing system 1100. For example, the input/output device 1120 includes a keyboard, a keypad and/or a displayer.

The memory 1130 includes a 3D semiconductor device according to an embodiment of the inventive concept. The memory 1130 may further include different kinds of memory. For example, the memory 1130 may further include a volatile memory device capable of random access, and various kinds of memories.

The interface 1140 transmits data to a communication network or receives data from a communication network.

A 3D semiconductor memory device according to an embodiment of the inventive concept is encapsulated using various packaging techniques, such as, for example, any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

Figure 18:
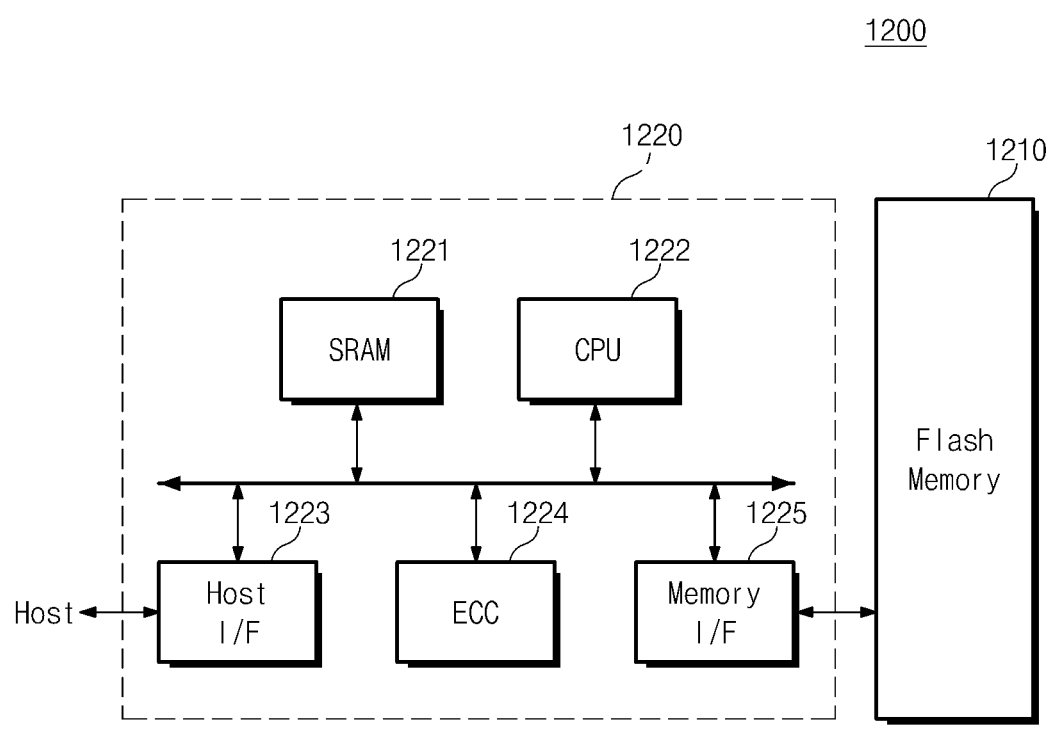
FIG. 18 is a schematic block diagram illustrating an example of a memory card including a 3D semiconductor memory device according to an embodiment of the inventive concept.

FIG. 18 is a schematic block diagram illustrating an example of a memory card including a 3D semiconductor memory device according to an embodiment of the inventive concept.

Referring to FIG. 18, a memory card 1200 for supporting storage capability of a large capacity of data includes a flash memory device 1210. The flash memory device 1210 includes a 3D semiconductor memory device according to an embodiment of the inventive concept. The memory card 1200 according to an embodiment of the inventive concept includes a memory controller 1220 controlling every data exchange between a host and the flash memory device 1210.

A static random access memory (SRAM) 1221 is used as an operation memory of a processing unit 1222. A host interface 1223 includes data exchange protocols of a host to be connected to the memory card 1200. An error correction block 1224 detects and corrects errors included in data readout from a multi bit flash memory device 1210. A memory interface 1225 interfaces with the flash memory device 1210 according to an embodiment of the inventive concept. The processing unit 1222 performs every control operation for exchanging data of the memory controller 1220. Even though not depicted in the drawings, it is apparent to one of ordinary skill in the art that the memory card 1200 according to an embodiment of the inventive concept can further include a ROM (not shown) storing code data for interfacing with the host.

Figure 19:
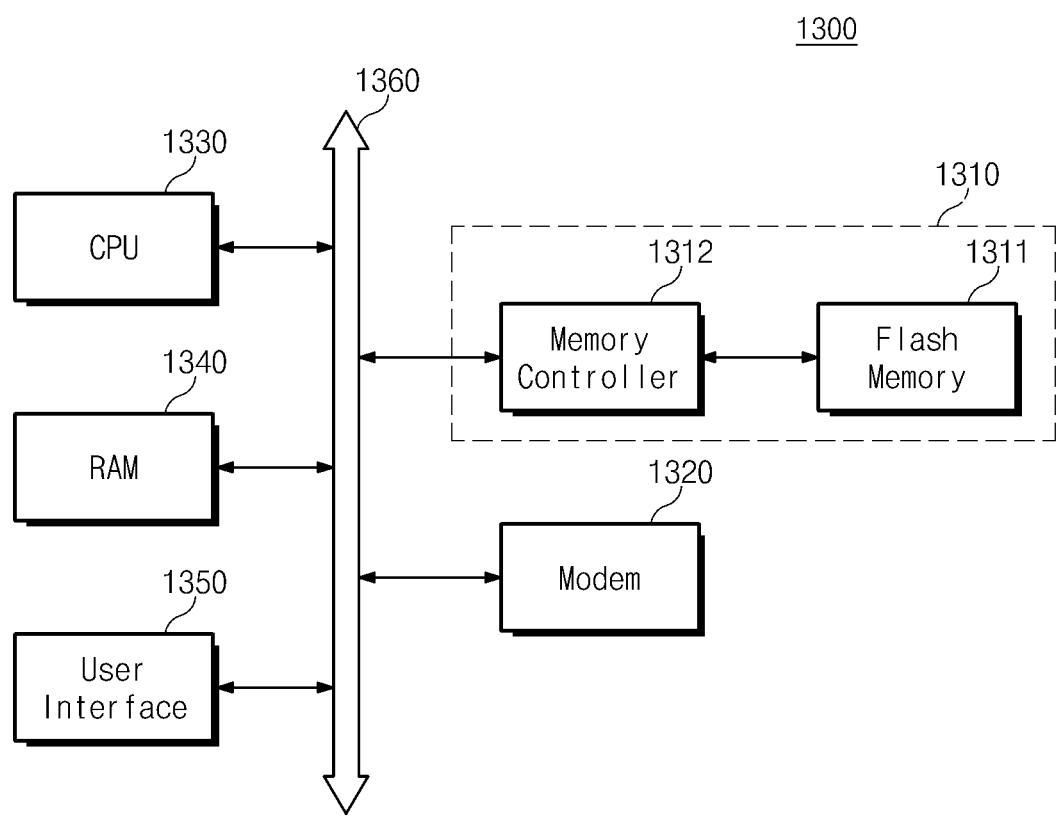
FIG. 19 is a schematic block diagram illustrating an example of a data processing system including a 3D semiconductor memory device according to an embodiment of the inventive concept.

FIG. 19 is a schematic block diagram illustrating an example of a data processing system including a 3D semiconductor memory device according to an embodiment of the inventive concept.

Referring to FIG. 19, a flash memory system 1310 is built in a data processing system, such as a mobile product or a desk top computer. The flash memory system 1310 includes a 3D semiconductor memory device according to an embodiment of the inventive concept. The data processing system 1300 according to an embodiment of the inventive concept includes the flash memory system 1310 and a modem 1320, a central processing unit (CPU) 1330, a RAM (Random Access Memory), and a user interface 1350 that are electrically connected to a system bus 1360. According to an embodiment, the flash memory system 1310 is identical to a memory system 1110 as shown in FIG. 17 or a flash memory card 1200 as shown in FIG. 18. The flash memory system 1310 stores data processed by the central processing unit 1330 or data inputted from an external device. The flash memory system 1310 includes a solid state disk (SSD) and then the data processing system 1310 can stably store huge amounts of data in the flash memory system 1310. As reliability is improved, the flash memory system 1310 can reduce resources used to correct errors, thereby providing a high speed data exchange function to the data processing system 1300. Even though not depicted in the drawings, it is apparent to one of ordinary skill in the art that the data processing unit 1300 according to an embodiment of the inventive concept can further include an application chipset, a camera image processor (CIS) and/or an input/output device.

According to the embodiments of the inventive concept, since a plurality of the cell strings share a bit line and one or more string selection lines, it is possible to improve integration density of the 3D semiconductor memory device. Since each of the cell strings includes string selection transistor units of which the threshold voltages are different from each other, a selected bit line can be selectively connected to one of the plurality of the cell strings.

Furthermore, each of the string selection transistor units includes a plurality of field effect transistors of which the gate electrodes are electrically connected to each other. Thus, the effective channel length of the string selection transistor unit may be increased. As a result, it is possible to suppress a leakage current caused by the short channel effects, thereby improving the reliability of the 3D semiconductor memory device.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A three-dimensional (3D) semiconductor memory device comprising:
    an electrode structure including a plurality of word lines and a first string selection line vertically stacked on a substrate;
    first and second semiconductor pillars penetrating the electrode structure;
    a data storage layer disposed between the electrode structure and the first and second semiconductor pillars; and
    a bit line crossing over the electrode structure, the bit line connected in common to the first and second semiconductor pillars,
    wherein the first string selection line and the first semiconductor pillar constitute a first string selection unit having a first threshold voltage, and the first string selection line and the second semiconductor pillar constitute a second string selection unit having a second threshold voltage different from the first threshold voltage.

2. The 3D semiconductor memory device of claim 1, wherein a dopant concentration of the first semiconductor pillar adjacent to the first string selection line is different from a dopant concentration of the second semiconductor pillar adjacent to the first string selection line.

3. The 3D semiconductor memory device of claim 1, wherein the data storage layer includes a charge storage layer; and
    wherein charges are stored in the charge storage layer between the first string selection line and the first semiconductor pillar.

4. The 3D semiconductor memory device of claim 1, wherein each of the first and second semiconductor pillars includes a channel region adjacent to the first string selection line; and
    wherein a conductivity type of the channel region of the first semiconductor pillar is different from a conductivity type of the channel region of the second semiconductor pillar.

5. The 3D semiconductor memory device of claim 1, wherein an operation voltage less than the first threshold voltage and greater than the second threshold voltage is applied to the first string selection line to electrically connect one of the first and second semiconductor pillars to the bit line.

6. The 3D semiconductor memory device of claim 1, wherein each of the first and second string selection units includes a plurality of field effect transistors of which gate electrodes are electrically connected to each other.

7. The 3D semiconductor memory device of claim 1, wherein the electrode structure further includes a second string selection line vertically stacked on the substrate;
    wherein the first and second string selection lines and the first semiconductor pillar constitute the first string selection unit and at least one more string selection unit which are connected in series to each other; and
    wherein the first and second string selection lines and the second semiconductor pillar constitute the second string selection unit and at least one more string selection unit which are connected in series to each other.

8. The 3D semiconductor memory device of claim 7, wherein a dopant region is disposed in the first semiconductor pillar at a first depth from an upper portion of the first semiconductor pillar, and a dopant region is disposed in the second semiconductor pillar at a second depth from an upper portion of the second semiconductor pillar, wherein the first depth is different from the second depth.

* * * * *